US012376465B2

United States Patent
Lee et al.

(10) Patent No.: US 12,376,465 B2
(45) Date of Patent: Jul. 29, 2025

(54) DISPLAY APPARATUS AND ELECTRONIC DEVICE INCLUDING A FIRST AUXILIARY PIXEL ELECTRODE AND A SECOND AUXILIARY PIXEL ELECTRODE HAVING AN ELLIPTICAL SHAPE

(71) Applicant: Samsung Display Co., Ltd., Yongin-Si (KR)

(72) Inventors: Wonse Lee, Yongin-si (KR); Donghyeon Jang, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 658 days.

(21) Appl. No.: 17/750,089

(22) Filed: May 20, 2022

(65) Prior Publication Data

US 2023/0040037 A1    Feb. 9, 2023

(30) Foreign Application Priority Data

Aug. 5, 2021   (KR) .......................... 10-2021-0103434

(51) Int. Cl.
*H10K 59/131* (2023.01)
*H10K 59/121* (2023.01)
(Continued)

(52) U.S. Cl.
CPC ......... *H10K 59/131* (2023.02); *H10D 86/441* (2025.01); *H10D 86/60* (2025.01);
(Continued)

(58) Field of Classification Search
CPC .. H10K 59/121; H10K 59/131; H10K 50/813; H10K 2102/311; H10K 59/1213;
(Continued)

(56) References Cited

U.S. PATENT DOCUMENTS 8,508,438 B2    8/2013 Suh
10,840,308 B2 *  11/2020 Choi ..................... H10K 50/814
(Continued)

FOREIGN PATENT DOCUMENTS

CN    111341936 A    6/2020
CN    111725285 A    9/2020
(Continued)

OTHER PUBLICATIONS

Korean Notice of Allowance corresponding to Application No. 10-2021-103434 and issued on Jan. 2, 2025, 3 pages.

*Primary Examiner* — Khiem D Nguyen
(74) *Attorney, Agent, or Firm* — Innovation Counsel LLP

(57) ABSTRACT

Provided are a display apparatus includes: a substrate having a main display region, a first auxiliary display region adjacent to the main display region in a first direction, a second auxiliary display region spaced apart from the main display region having the first auxiliary display region therebetween, an intermediate display region adjacent to the first auxiliary display region and the second auxiliary display region; a first auxiliary pixel electrode arranged in the first auxiliary display region and having an elliptical shape having a long axis and a short axis; a second auxiliary pixel electrode arranged in the second auxiliary display region; and a first auxiliary pixel circuit and a second auxiliary pixel circuit arranged in the intermediate display region and respectively electrically connected to the first auxiliary pixel electrode and the second auxiliary pixel electrode, wherein a long axis of the first auxiliary pixel electrode extends in a second direction intersecting with the first direction.

20 Claims, 12 Drawing Sheets

(51) Int. Cl.
  *H10K 59/35*     (2023.01)
  *H10K 77/10*     (2023.01)
  *H10D 86/40*     (2025.01)
  *H10D 86/60*     (2025.01)
  *H10K 102/00*     (2023.01)

(52) U.S. Cl.
  CPC ....... *H10K 59/1213* (2023.02); *H10K 59/351* (2023.02); *H10K 77/111* (2023.02); *H10K 2102/311* (2023.02)

(58) Field of Classification Search
  CPC ............. H10K 59/3515; H10K 59/123; H10K 59/80515; H10K 50/814; H10K 77/111; H10D 86/60
  See application file for complete search history.

(56) References Cited

U.S. PATENT DOCUMENTS

| | | | |
|---|---|---|---|
| 11,489,036 B2 | 11/2022 | Chae et al. | |
| 11,665,947 B2 | 5/2023 | Kim et al. | |
| 11,672,153 B2 | 6/2023 | Chae et al. | |
| 11,678,535 B2 | 6/2023 | Shim et al. | |
| 12,016,230 B2 | 6/2024 | Chae et al. | |
| 12,069,892 B2 | 8/2024 | Kim et al. | |
| 2016/0358992 A1* | 12/2016 | Ha | H10K 59/80516 |
| 2017/0324063 A1* | 11/2017 | Ohara | H10K 50/828 |
| 2018/0062109 A1* | 3/2018 | Kim | H10K 59/8723 |
| 2021/0134932 A1* | 5/2021 | Chae | H10K 59/121 |
| 2021/0202641 A1* | 7/2021 | Shin | H10K 59/131 |

FOREIGN PATENT DOCUMENTS

| | | |
|---|---|---|
| CN | 111769147 A | 10/2020 |
| KR | 10-2007-0078905 A | 8/2007 |
| KR | 10-2020-0126463 A | 11/2020 |
| KR | 10-2021-0016141 A | 2/2021 |
| KR | 10-2021-0048649 A | 5/2021 |
| KR | 10-2021-0052724 A | 5/2021 |
| KR | 10-2021-0059091 A | 5/2021 |
| KR | 10-2021-0078650 A | 6/2021 |
| KR | 10-2021-0087613 A | 7/2021 |

* cited by examiner

DISPLAY APPARATUS AND ELECTRONIC DEVICE INCLUDING A FIRST AUXILIARY PIXEL ELECTRODE AND A SECOND AUXILIARY PIXEL ELECTRODE HAVING AN ELLIPTICAL SHAPE

CROSS-REFERENCE TO RELATED APPLICATION

This application claims priority under 35 U.S.C. § 119 to Korean Patent Application No. 10-2021-0103434, filed on Aug. 5, 2021, in the Korean Intellectual Property Office; the Korean Patent Application is incorporated by reference.

BACKGROUND

1. Field

The technical field relates to a display apparatus and an electronic device including the display apparatus.

2. Description of the Related Art

A display apparatus may display images in response to input signals. Display apparatuses may be included in various electronic devices.

A display apparatus may include a display region for displaying images. Various functions associated with or linked to the display apparatus may be added to the display region.

SUMMARY

One or more embodiments may be related to a display apparatus that includes a display region for displaying an image as well as for enabling an electronic component to perform one or more additional functions. One or more embodiments may be related to an electronic device that includes the display apparatus. However, the one or more embodiments are only examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate having a main display region, a first auxiliary display region adjacent to the main display region in a first direction, a second auxiliary display region spaced apart from the main display region having the first auxiliary display region therebetween, and an intermediate display region adjacent to the first auxiliary display region and the second auxiliary display region, a first auxiliary pixel electrode arranged in the first auxiliary display region and having an elliptical shape having a long axis and a short axis, a second auxiliary pixel electrode arranged in the second auxiliary display region and having an elliptical shape having a long axis and a short axis, and a first auxiliary pixel circuit and a second auxiliary pixel circuit arranged in the intermediate display region and respectively electrically connected to the first auxiliary pixel electrode and the second auxiliary pixel electrode,
wherein a long axis of the first auxiliary pixel electrode extends in a second direction intersecting with the first direction.

An extension direction of a long axis of the second auxiliary pixel electrode may intersects with an extension direction of the long axis of the first auxiliary pixel electrode.

The long axis of each of the plurality of second auxiliary pixel electrodes may extend in the first direction.

The display apparatus may further include a first connection wire electrically connecting the first auxiliary pixel circuit and the first auxiliary pixel electrode to each other, wherein the first connection wire may be connected to the first auxiliary pixel electrode via a first contact portion arranged on one side of the first auxiliary pixel electrode.

The display apparatus may further include a pixel defining layer including a first opening exposing a portion of the first auxiliary pixel electrode, wherein the first opening of the pixel defining layer does not overlap the first contact portion in a plan view.

The first auxiliary display region may include a 1-1 region arranged on one side and a 1-2 region arranged on the other side with respect to a virtual center line extending in the first direction, the first auxiliary pixel electrode may be provided as a plurality of first auxiliary pixel electrodes, and the plurality of first auxiliary pixel electrodes may include a 1-1 auxiliary pixel electrode arranged in the 1-1 region and a 1-2 auxiliary pixel electrode arranged in the 1-2 region, and the first opening may be provided as a plurality of first openings of the pixel defining layer, and the plurality of first openings may include a 1-1 opening overlapping the 1-1 auxiliary pixel electrode and a 1-2 opening overlapping the 1-2 auxiliary pixel electrode, wherein a center of the 1-1 opening may be spaced apart from a short axis of the 1-1 auxiliary pixel electrode in the second direction, and a center of the 1-2 opening may be spaced apart from a short axis of the 1-2 auxiliary pixel electrode in a direction opposite to the second direction.

The display apparatus may further include a second connection wire electrically connecting the second auxiliary pixel circuit and the second auxiliary pixel electrode to each other, wherein the second connection wire may be connected to the second auxiliary pixel electrodes via a second contact portion arranged on one side of the second auxiliary pixel electrode.

The display apparatus may further include a pixel defining layer including a second opening exposing a portion of the second auxiliary pixel electrode, wherein the second opening of the pixel defining layer does not overlap the second contact portion in a plan view.

The second auxiliary pixel electrode may be provided as a plurality of second auxiliary pixel electrodes, the plurality of second auxiliary pixel electrodes may include a 2-1 auxiliary pixel electrode arranged in a first row and a 2-2 auxiliary pixel electrode arranged in a second row adjacent to the first row, the second connection wire may be provided as a plurality of second connection wires, the plurality of second connection wires may include a 2-1 connection wire electrically connected to the 2-1 auxiliary pixel electrode via a 2-1 contact portion and a 2-2 connection wire electrically connected to the 2-2 auxiliary pixel electrode via a 2-2 contact portion, and the 2-1 contact portion may be spaced apart from a short axis of the 2-1 auxiliary pixel electrode in the first direction, and the 2-2 contact portion may be spaced apart from a short axis of the 2-2 auxiliary pixel electrode in a direction opposite to the first direction.

The display apparatus may further include a main pixel electrode arranged in the main display region, a main pixel circuit arranged in the main display region and electrically connected to the main pixel electrode, an intermediate pixel electrode arranged in the intermediate display region, and an intermediate pixel circuit arranged in the intermediate display region and electrically connected to the intermediate pixel electrode.

The display apparatus may further include an intermediate layer on the first auxiliary pixel electrode and the second auxiliary pixel electrode, and a counter electrode arranged on the intermediate layer and covering the first auxiliary pixel electrode and the second auxiliary pixel electrode.

According to one or more embodiments, an electronic device including a display apparatus including a main display region, a first auxiliary display region adjacent to the main display region in a first direction, a second auxiliary display region spaced apart from the main display region having the first auxiliary display region therebetween, an intermediate display region arranged adjacent to the first auxiliary display region and the second auxiliary display region, and an electronic component arranged to overlap a transmissive region provided in the first auxiliary display region and the second auxiliary display region, wherein the display apparatus may include: a first auxiliary pixel electrode arranged in the first auxiliary display region and having an elliptical shape having a long axis and a short axis, a second auxiliary pixel electrode arranged in the second auxiliary display region and having an elliptical shape having a long axis and a short axis, and a first auxiliary pixel circuit and a second auxiliary pixel circuit arranged in the intermediate display region and respectively electrically connected to the first auxiliary pixel electrode and the second auxiliary pixel electrode, wherein a long axis of the first auxiliary pixel electrode extends in a second direction intersecting with the first direction.

An extension direction of a long axis of the second auxiliary pixel electrode may intersect with an extension direction of the long axis of the first auxiliary pixel electrode.

The long axis of the second auxiliary pixel electrode may extend in the first direction.

The electronic device may further include a first connection wire electrically connecting the first auxiliary pixel circuit and the first auxiliary pixel electrode to each other, wherein the first connection wire may be connected to the first auxiliary pixel electrode via a first contact portion arranged on one side of the first auxiliary pixel electrode.

The electronic device may further include a pixel defining layer including a first opening exposing a portion of the first auxiliary pixel electrode, wherein the first opening of the pixel defining layer does not overlap the first contact portion in a plan view.

The first auxiliary display region may include a 1-1 region arranged on one side and a 1-2 region arranged on other side with respect to a virtual center line extending in the first direction, the first auxiliary pixel electrode may be provided as a plurality of first auxiliary pixel electrodes, and the plurality of first auxiliary pixel electrodes may include a 1-1 auxiliary pixel electrode arranged in the 1-1 region and a 1-2 auxiliary pixel electrode arranged in the 1-2 region, and the first opening may be provided as a plurality of first openings of the pixel defining layer, and the plurality of first openings may include a 1-1 opening overlapping the 1-1 auxiliary pixel electrode and a 1-2 opening overlapping the 1-2 auxiliary pixel electrode, wherein a center of the 1-1 opening may be spaced apart from a short axis of the 1-1 auxiliary pixel electrode in the second direction, and a center of the 1-2 opening may be spaced apart from a short axis of the 1-2 auxiliary pixel electrode in a direction opposite to the second direction.

The electronic device may further include a second connection wire electrically connecting the second auxiliary pixel circuit and the second auxiliary pixel electrode to each other, wherein the plurality of second connection wire may be connected to the plurality of second auxiliary pixel electrode via a second contact portion arranged on one side of the second auxiliary pixel electrode.

The electronic device may further include a pixel defining layer including a second opening exposing a portion of the second auxiliary pixel electrode, wherein the second opening may do not overlap the second contact portion in a plan view.

The second auxiliary pixel electrode may be provided as a plurality of second auxiliary pixel electrodes and the plurality of second auxiliary pixel electrodes may include a 2-1 auxiliary pixel electrode arranged in a first row and a 2-2 auxiliary pixel electrode arranged in a second row adjacent to the first row, the second connection wire may be provided as a plurality of second connection wires and the plurality of second connection wires may include a 2-1 connection wire electrically connected to the 2-1 auxiliary pixel electrode via a 2-1 contact portion and a 2-2 connection wire electrically connected to the 2-2 auxiliary pixel electrode via a 2-2 contact portion, the 2-1 contact portion may be spaced apart from a short axis of the 2-1 auxiliary pixel electrode in the first direction, and the 2-2 contact portion may be spaced apart from a short axis of the 2-2 auxiliary pixel electrode in a direction opposite to the first direction.

These and/or other aspects will become apparent and more readily appreciated from the following description of the embodiments, the claims, and the accompanying drawings.

DETAILED DESCRIPTION

Figure 1:
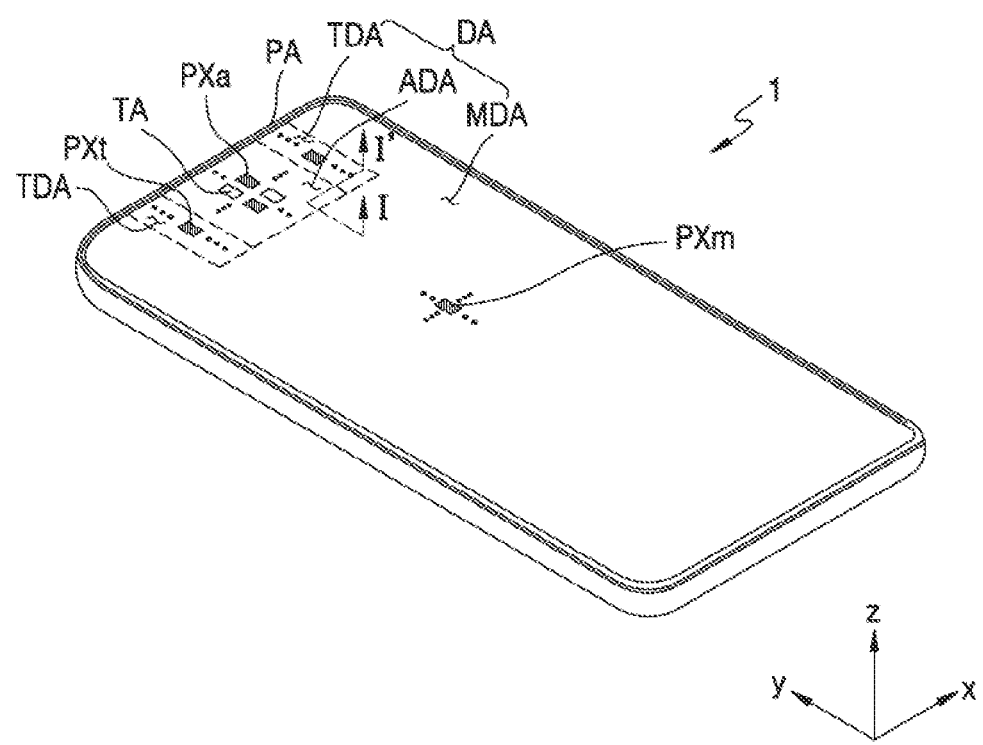
FIG. 1 is a schematic perspective view of an electronic device according to an embodiment.

Examples of embodiments are described with reference to the accompanying drawings. Same reference numerals may refer to same elements throughout. Practical embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing them will be apparent when referring to embodiments described with reference to the drawings. This disclosure may, however, be embodied in many different forms and should not be construed as limited to the embodiments set forth herein.

Hereinafter, embodiments of the disclosure will now be described in detail with reference to the accompanying drawings. When described with reference to the drawings, identical or corresponding components will be given the same reference numerals, and redundant description of these components will be omitted.

It will be understood that although the terms "first," "second," etc. may be used herein to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may indicate plural forms as well, unless the context clearly indicates otherwise.

The terms "comprise(s)" and/or "comprising" may specify the presence of stated features or components, but may not preclude the presence or addition of one or more other features or components.

It will be understood that when a layer, region, or component is referred to as being "on" another layer, region, or component, it can be directly or indirectly on the other layer, region, or component. One or more intervening layers, regions, or components may be present between the first element and the second element.

Dimensions illustrated in the drawings may be exaggerated for convenience of explanation. For example, since sizes and thicknesses of components in the drawings are arbitrarily illustrated for convenience of explanation, the following embodiments are not limited to the illustrated dimensions.

When a certain embodiment may be implemented differently, a specific process order may be performed differently from the described order. For example, two consecutively described processes may be performed substantially at the same time or may be performed in an order opposite to the described order.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. It will be understood that when a layer, region, or component is referred to as being "connected to" another layer, region, or component, it can be directly or/and indirectly connected to the other layer, region, or component. That is, for example, intervening layers, regions, or components may be present. For example, it will be understood that when a layer, region, or component is referred to as being "electrically connected to" another layer, region, or component, it can be directly and/or indirectly electrically connected to the other layer, region, or component. That is, for example, intervening layers, regions, or components may be present.

The x-axis, the y-axis, and the z-axis are not limited to three axes of the rectangular coordinate system, and may be interpreted in a broader sense. For example, the x-axis, the y-axis, and the z-axis may represent directions that are perpendicular to one another, or some of the axes may represent different directions that are not perpendicular to each other.

FIG. 1 is a schematic perspective view of an electronic device according to an embodiment.

Referring to FIG. 1, an electronic device 1 may include a display region DA and a peripheral region PA outside the display region DA. The display region DA may include a main display region MDA, an auxiliary display region ADA adjacent to the main display region MDA, and an intermediate display region TDA between the main display region MDA and the auxiliary display region ADA. The main display region MDA may surround at least a portion of the auxiliary display region ADA. The intermediate display region TDA is adjacent to the auxiliary display region ADA, and may be arranged at one or more sides of the auxiliary display region ADA.

The electronic device 1 may provide an image through a two-dimensional array of pixels PX arranged in the display region DA. For example, the electronic device 1 may provide a first image using light emitted from main pixels PXm arranged in the main display region MDA, and may provide a second image using light emitted from a plurality of auxiliary pixels PXa arranged in the auxiliary display region ADA. Also, in some embodiments, the electronic device 1 may provide a third image using light emitted from intermediate pixels PXt arranged in the intermediate display region TDA. In some embodiments, the first to third images may be portions of an image provided through the display region DA of the electronic device 1. Also, in some embodiments, the first to third images may be independent from one another.

For example, FIG. 1 shows that one auxiliary display region ADA is located in the display region DA. In another embodiment, the electronic device 1 may have two or more auxiliary display regions ADA, and the auxiliary display regions ADA may have different shapes and/or sizes. In a plan view of the electronic device 1, the auxiliary display region ADA may have a shape such as a polygon (e.g., a quadrangle). Alternatively, the auxiliary display region ADA may have various shape such as a circle, an oval, a star, and a diamond. In an embodiment, a ratio of the auxiliary display region ADA to the display region DA may be smaller than a ratio of the main display region MDA to the display region DA.

FIG. 1 shows that the auxiliary display region ADA is arranged at an upper center of the main display region MDA, which has an approximately quadrangle shape. The auxiliary display region ADA may be arranged, for example, at an upper right side or an upper left side of the main display region MDA. The auxiliary display region ADA may be arranged at an inner part of the main display region MDA as shown in FIG. 1, and may be entirely surrounded by the main display region MDA. As another example, the auxiliary display region ADA is arranged at one side of the main display region MDA and may be partially surrounded by the main display region MDA. For example, the auxiliary display region ADA positioned at one corner of the main display region MDA may be partially surrounded by the main display region MDA.

An electronic component 20 (see FIG. 2) may be arranged in the auxiliary display region ADA. The electronic component 20 may be arranged under a display apparatus 10 (see FIG. 2) to correspond to the auxiliary display region ADA. In order for the electronic component 20 to function satisfactorily, the auxiliary display region ADA may include a transmission region TA through which light or/and sound may be output to the outside from the electronic component 20 and/or may travel from the outside toward the electronic component 20.

The transmission region TA may transmit light and may include no pixels PX. In a case of the electronic device 1 according to an embodiment of the disclosure, when light is transmitted through the auxiliary display region ADA including the transmission region TA, the light transmittance may be about 10% or more, for example, about 25% or more, about 40% or more, about 50% or more, about 85% or more, or about 90% or more.

The main display region MDA and the auxiliary display region ADA may have different resolutions. Because the auxiliary display region ADA includes the transmission region TA, an array of the main pixels PXm arranged in the main display region MDA and an array of the auxiliary pixels PXa arranged in the auxiliary display region ADA may be different from each other. For example, the transmission region TA may be arranged between adjacent auxiliary pixels PXa among the auxiliary pixels PXa. In this case, the auxiliary display region ADA may have a resolution lower than that of the main display region MDA. Because the auxiliary display region ADA includes the transmission region TA, the number of auxiliary pixels PXa per unit area in the auxiliary display region ADA may be less than the number of main pixels PXm per unit area in the main display region MDA. For example, a resolution of the auxiliary display region ADA may be about ½, ⅜, ⅓, ¼, ⅖, ⅛, ⅑, or 1/16 of a resolution of the main display region MDA. For example, the resolution of the main display region MDA may be about 400 ppi or more, and the resolution of the auxiliary display region ADA may be about 200 ppi or about 100 ppi.

The intermediate display region TDA may have a resolution equal or unequal to that of the main display region MDA. For example, the intermediate display region TDA may have a resolution equal to or lower than a resolution of the main display region MDA. For example, the intermediate display region TDA may have a resolution equal to that of the auxiliary display region ADA. Alternatively, as another example, the intermediate display region TDA may have a resolution higher than that of the auxiliary display region ADA.

The peripheral region PA may not provide an image, and may entirely or partially surround the display region DA. For example, the peripheral region PA may entirely or partially surround the main display region MDA, the auxiliary display region ADA, and/or the intermediate display region TDA. A driver for providing the display region DA with an electrical signal and/or a power source may be arranged in the peripheral region PA. A pad may be arranged in the peripheral region PA and may be electrically connected to electronic elements, printed circuit boards, or the like.

Hereinafter, a case in which the electronic device 1 is used in a smartphone will be described for convenience of description, but the electronic device 1 of the disclosure is not limited thereto. The electronic device 1 may be/represent a television, a laptop computer, a monitor, a billboard, an Internet of Things (IoT) device, a mobile phone, a smartphone, a tablet personal computers (PCs), mobile a communication terminal, an electronic notebook, an e-book, a portable multimedia player (PMP), a navigator, an ultra-mobile PC (UMPC). Also, the electronic device 1 may be/represent a wearable device such as a smart watch, a watch phone, a glass-type display, a head mounted display, Also, The electronic device 1 may be/represent a vehicle's dashboard, a center information display (CID) arranged at a vehicle's center fascia or dashboard, a vehicle rear view display, a seat back display screen, or another electronic device.

Also, hereinafter, it will be described that the electronic device 1 may include an organic light-emitting diode (OLED) as a light-emitting element, but the electronic device 1 of the disclosure is not limited thereto. In another embodiment, the electronic device 1 may be a light-emitting display apparatus including an inorganic light-emitting diode, that is, an inorganic light-emitting display apparatus. In another embodiment, the electronic device 1 may be a quantum dot light-emitting display apparatus.

Figure 2:
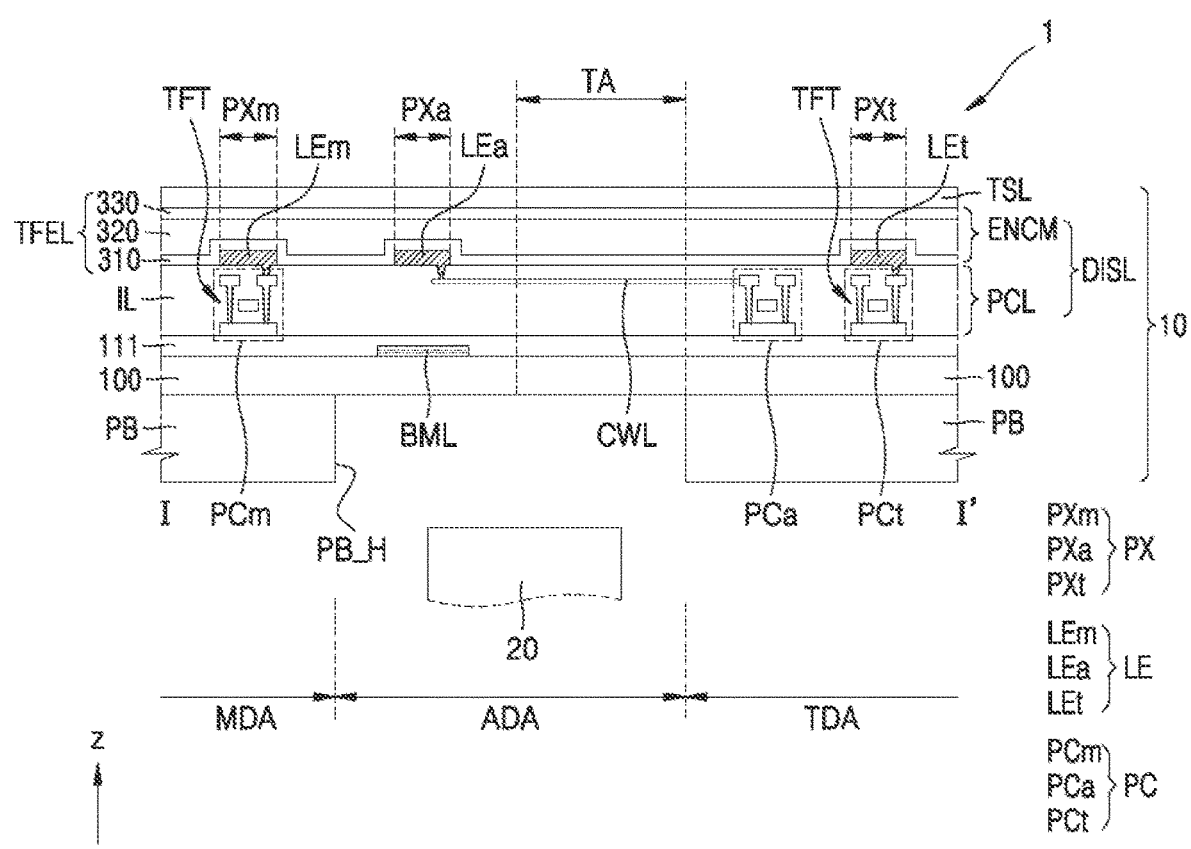
FIG. 2 is a schematic cross-sectional view of a portion of an electronic device according to an embodiment.

FIG. 2 is a schematic cross-sectional view of a portion of an electronic device according to an embodiment.

Referring to FIG. 2, the electronic device 1 may include a display apparatus 10 and an electronic component 20 overlapped by the display apparatus 10. A cover window (not shown) for protecting the display apparatus 10 may be arranged on the display apparatus 10.

The display apparatus 10 may include the main display region MDA providing the first image and the auxiliary display region ADA. The auxiliary display region ADA may provide the second image and overlap the electronic component 20. Also, the display apparatus 10 may include the intermediate display region TDA providing the third image. The display apparatus 10 may include a substrate 100, a display layer DISL on the substrate 100, a touchscreen layer TSL, and a panel protection member PB arranged under the substrate 100.

The display layer DISL may include a pixel circuit layer PCL including a pixel circuit PC, a light-emitting element layer including a light-emitting element LE, and a sealing member ENCM. For example, the sealing member ENCM may be a thin-film encapsulation layer TFEL. A buffer layer 111 may be arranged between the substrate 100 and the display layer DISL, and an insulating layer IL may be arranged in the display layer DISL.

The substrate 100 may include an insulation material such as glass, quartz, or a polymer resin. The substrate 100 may be a rigid substrate or a flexible substrate capable of bending, folding, rolling, or the like.

Main pixel circuits PCm and main light-emitting elements LEm (respectively electrically connected to the main pixel circuits PCm) may be arranged in the main display region MDA of the display apparatus 10. A main pixel circuit PCm includes at least one thin-film transistor TFT, and may control light emission of a main light-emitting element LEm. The main light-emitting element LEm emits light through an emission region, and the emission region may be defined as a main pixel PXm. That is, the main pixel PXm may be implemented by light emission of the main light-emitting element LEm. For example, the main pixel PXm may be a sub-pixel.

Auxiliary light-emitting elements LEa may be arranged in the auxiliary display region ADA of the display apparatus 10. In some embodiments, an auxiliary pixel circuit PCa for controlling light emission of an auxiliary light-emitting element LEa may not be arranged in the auxiliary display region ADA, and may be arranged in another region. For example, the auxiliary pixel circuit PCa may be arranged in the intermediate display region TDA adjacent to the auxiliary display region ADA.

The auxiliary pixel circuit PCa includes at least one thin film transistor TFT, and may be electrically connected to the auxiliary light-emitting element LEa by a connection wire CWL. The auxiliary pixel circuit PCa may control light emission of the auxiliary light-emitting element LEa. The auxiliary light-emitting element LEa emits light through an emission region, and the emission region may be defined as an auxiliary pixel PXa. That is, the auxiliary pixel PXa may be implemented by light emission of the auxiliary light-emitting element LEa. For example, the auxiliary pixel PXa may be a sub-pixel.

The auxiliary display region ADA may include the transmission region TA outside the auxiliary light-emitting element LEa. The transmission region TA may transmit light and/or a signal emitted from the electronic component 20 arranged to correspond to the auxiliary display region ADA and/or provided toward the electronic component 20.

The connection wire CWL electrically connecting the auxiliary pixel circuit PCa to the auxiliary light-emitting element LEa may cross the transmission region TA. For example, the connection wire CWL may include a transparent conductive material. Because the connection wire CWL has a high transmittance, even when the connection wire CWL is arranged in the transmission region TA, sufficient transmittance of the transmission region TA may be substantially maintained. Also, in an embodiment of the disclosure, because the auxiliary pixel circuit PCa is not arranged in the auxiliary display region ADA, an area of the transmission region TA may be sufficient; thus, light transmittance of the auxiliary display region ADA may be sufficient.

Intermediate pixel circuits PCt and intermediate light-emitting elements LEt (respectively electrically connected to the intermediate pixel circuits PCt) may be arranged in the intermediate display region TDA. An intermediate pixel circuit PCt includes at least one thin-film transistor TFT, and may control light emission of an intermediate light-emitting element LEt. The intermediate light-emitting element LEt emits light through an emission region, and the emission region may be defined as an intermediate pixel PXt. That is, the intermediate pixel PXt may be implemented by light emission of the intermediate light-emitting element LEt. For example, the intermediate pixel PXt may be a sub-pixel.

The light-emitting elements LE may be covered by the thin-film encapsulation layer TFEL. In some embodiments, the thin-film encapsulation layer TFEL may include at least one inorganic encapsulation layer and at least one organic encapsulation layer, as shown in FIG. 2. In an embodiment, the thin-film encapsulation layer TFEL may include an organic encapsulation layer 320 between a first inorganic encapsulation layer 310 and a second inorganic encapsulation layer 330.

The touchscreen layer TSL may obtain coordinate information in response to an external input, for example, a touch event. The touchscreen layer TSL may include a touch electrode and touch wires connected to the touch electrode. The touchscreen layer TSL may detect an external input by a self-capacitance method or a mutual capacitance method.

The touchscreen layer TSL may be formed on the thin-film encapsulation layer TFEL. Alternatively, the touchscreen layer TSL may be separately formed on a touch substrate and then coupled onto the thin-film encapsulation layer TFEL through an adhesive layer such as an optically clear adhesive (OCA). In an embodiment, the touchscreen layer TSL may be directly formed on the thin-film encapsulation layer TFEL, and in this case, no adhesive layer may be interposed between the touchscreen layer TSL and the thin-film encapsulation layer TFEL.

The panel protection member PB may be attached under the substrate 100 to support and protect the substrate 100. The panel protection member PB may include a hole PB_H corresponding to the auxiliary display region ADA. The hole PB_H may facilitate light transmittance of the auxiliary display region ADA. The panel protection member PB may include polyethylene terephthalate (PET) or polyimide (PI).

An area of the auxiliary display region ADA may be greater than an area in which the electronic component 20 is arranged. An area of the hole PB_H included in the panel protection member PB may be equal or unequal to the area of the auxiliary display region ADA.

The electronic component 20 may be arranged in the auxiliary display region ADA. The electronic component 20 may be an electronic element using light and/or sound. For example, the electronic element may be a sensor that measures distances, such as a proximity sensor, a sensor that recognizes a portion of a user's body (e.g., a fingerprint, an iris, a face, etc.), a small lamp that outputs light, or an image sensor that captures an image (e.g., a camera). The electronic element may use light of various wavelength bands, such as visible light, infrared light, and/or ultraviolet light. The electronic element may use ultrasonic waves or sound of another frequency band. In some embodiments, multiple electronic components 20 may be arranged in the auxiliary display region ADA. In this case, the electronic components 20 may have different functions.

In some embodiments, a bottom metal layer BML may be arranged in the auxiliary display region ADA. The bottom metal layer BML is arranged between the substrate 100 and the auxiliary light-emitting element LEa, and may overlap the auxiliary light-emitting element LEa. The bottom metal layer BML may include a light blocking material, and may block external light from reaching the auxiliary light-emitting element LEa.

Figure 3A:
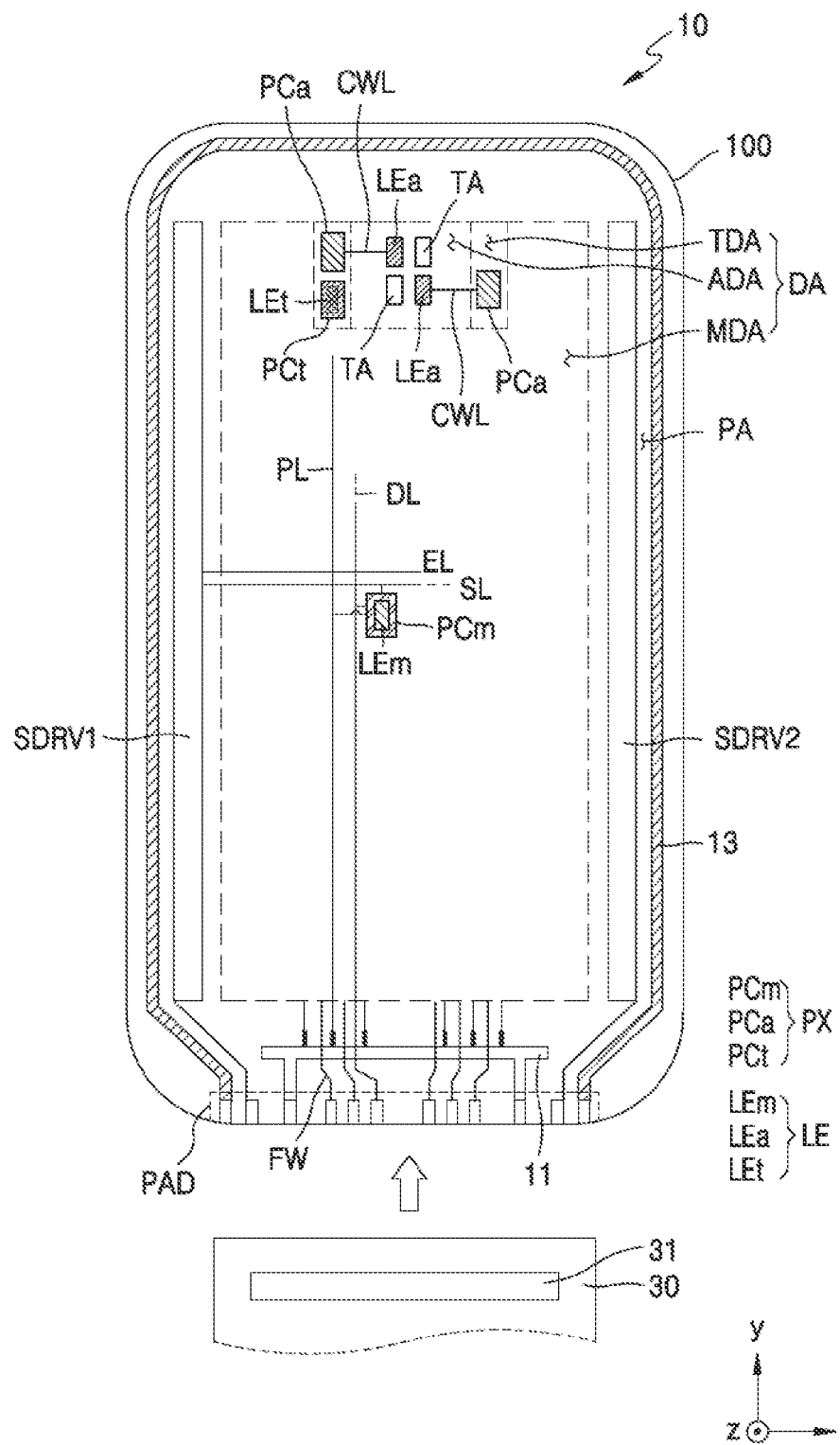
FIG. 3A is a schematic plan view of a portion of a display apparatus according to an embodiment.
Figure 3B:
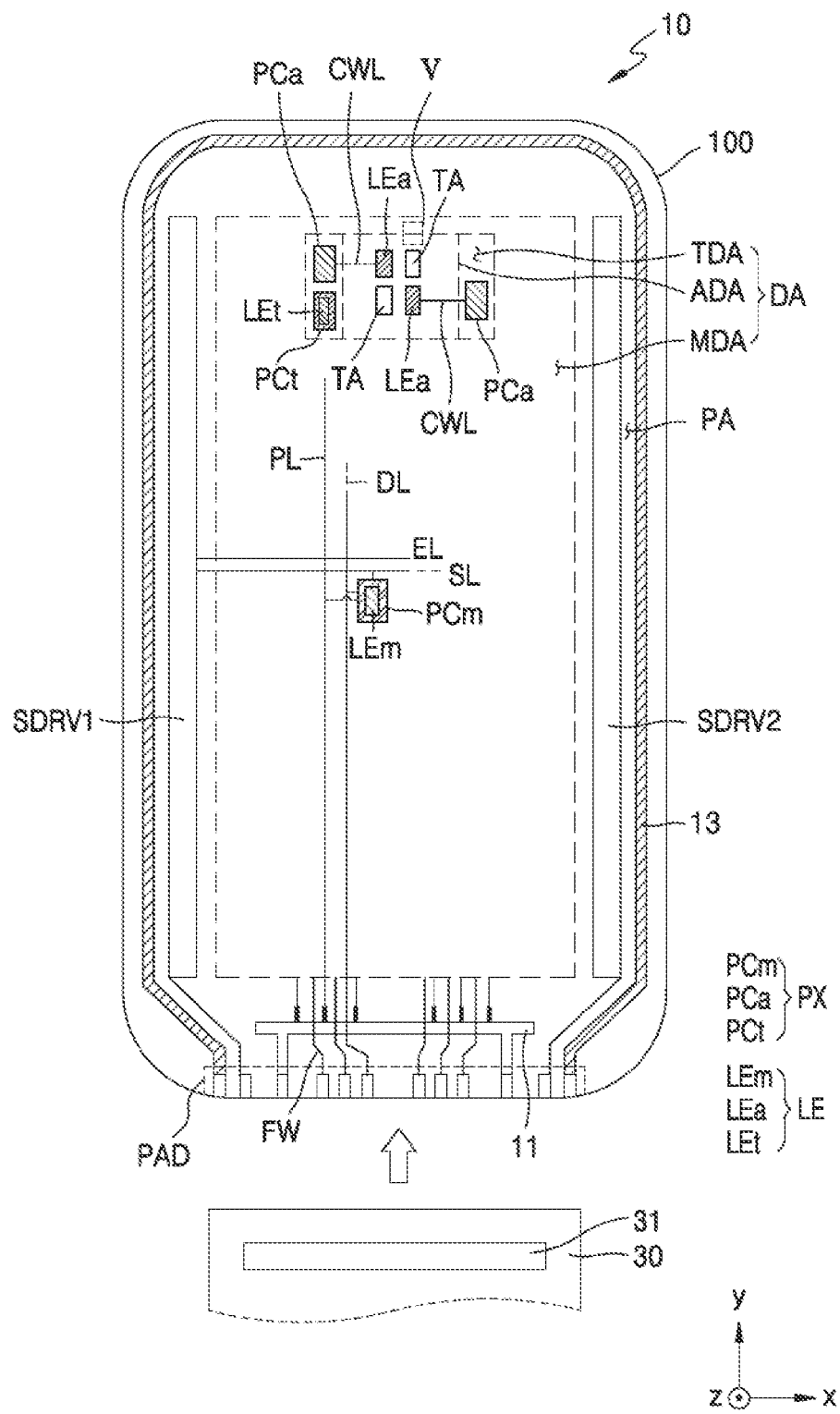
FIG. 3B is a schematic plan view of a portion of a display apparatus according to an embodiment.

FIGS. 3A and 3B are each a schematic plan view of a portion of a display apparatus according to an embodiment. FIG. 3B may be a modified example of a portion of a display apparatus of FIG. 3A.

Referring to FIG. 3A, various components constituting a display apparatus 10 may be arranged on a substrate 100. The display apparatus 10 may include a display region DA and a peripheral region PA surrounding the display region DA. The display region DA may include a main display region MDA, an auxiliary display region ADA adjacent to the main display region MDA, and an intermediate display region TDA between the main display region MDA and the auxiliary display region ADA.

A main light-emitting element LEm, such as an organic light-emitting diode OLED, may be arranged in the main display region MDA. The main light-emitting element LEm may emit light having a certain color. The main light-emitting element LEm may emit, for example, red light, green light, blue light, or white light. A main pixel circuit PCm for driving the main light-emitting element LEm is arranged in the main display region MDA and may be electrically connected to the main light-emitting element LEm. For example, the main pixel circuit PCm may overlap the main light-emitting element LEm.

The auxiliary display region ADA may be located at one side of the display region DA as shown in FIG. 3A, and may be partially surrounded by the main display region MDA. An auxiliary light-emitting element LEa, such as the organic light-emitting diode OLED, may be arranged in the auxiliary display region ADA. The auxiliary light-emitting element LEa may emit light having a certain color. The auxiliary light-emitting element LEa may emit, for example, red light, green light, blue light, or white light.

Also, the auxiliary display region ADA may include a transmission region TA. The transmission region TA may be arranged to surround auxiliary light-emitting elements LEa. Alternatively, the transmission region TA and auxiliary light-emitting elements LEa may be arranged in a grid configuration.

The intermediate display region TDA is arranged between the main display region MDA and the auxiliary display region ADA, and may partially surround the auxiliary display region ADA. For example, as shown in FIG. 3A, the intermediate display region TDA may be arranged on a left side (for example, −x direction side) and/or a right side (for example, +x direction side) of the auxiliary display region ADA in a plan view of the display apparatus 10. As another example, the intermediate display region TDA may be arranged above (for example, +y direction side) and below (for example, −y direction side) the auxiliary display region ADA. As another example, the intermediate display region TDA may be arranged on the left side, the right side, above, and below the auxiliary display region ADA.

An auxiliary pixel circuit PCa for driving the auxiliary light-emitting element LEa is arranged in the intermediate display region TDA and may be electrically connected to the auxiliary light-emitting element LEa via a connection wire CWL. That is, the auxiliary pixel circuit PCa may be arranged in the intermediate display region TDA adjacent to the auxiliary display region ADA. That is, the auxiliary pixel circuit PCa may be arranged adjacent to an outer side of the auxiliary display region ADA. The auxiliary pixel circuit PCa and the auxiliary light-emitting element LEa may be electrically connected to each other by the connection wire CWL extending in, for example, a +x direction or a −x direction. In this case, the connection wire CWL may extend, for example, in an extension direction of a scan line SL. As such, because the auxiliary pixel circuit PCa is not arranged in the auxiliary display region ADA, an area of the transmission region TA may be sufficient; thus, light transmittance of the auxiliary display region ADA may be sufficient.

An intermediate light-emitting element LEt, such as an organic light-emitting diode OLED, may be arranged in the intermediate display region TDA. The intermediate light-emitting element LEt may emit light having a certain color. The intermediate light-emitting element LEt may emit, for example, red light, green light, blue light, or white light. An intermediate pixel circuit PCt for driving the intermediate light-emitting element LEt is arranged in the intermediate display region TDA and may be electrically connected to the intermediate light-emitting element LEt. For example, the intermediate light-emitting element LEt may overlap the intermediate pixel circuit PCt. As another example, the intermediate light-emitting element LEt may overlap at least a portion of the auxiliary pixel circuit PCa arranged in the intermediate display region TDA.

Each of the main pixel circuit PCm, the auxiliary pixel circuit PCa, and the intermediate pixel circuit PCt may be electrically connected to external circuits arranged in the peripheral region PA. A first scan driving circuit SDRV1, a second scan driving circuit SDRV2, a terminal PAD, a driving voltage supply line 11, and a common voltage supply line 13 may be arranged in the peripheral region PA.

The first scan driving circuit SDRV1 may apply scan signals Sn (refer to FIG. 4) to some or all of the main pixel circuits PCm driving main light-emitting elements LEm via scan lines SL. The first scan driving circuit SDRV1 may apply light-emitting control signals to some or all of the main pixel circuits PCm via light-emitting control lines EL. The second scan driving circuit SDRV2 may be located on the opposite side of the first scan driving circuit SDRV1 with respect to the main display region MDA, and may extend substantially parallel to the first scan driving circuit SDRV1. Some of the main pixel circuits PCm of the main display region MDA may be electrically connected to the first scan driving circuit SDRV1, and the others may be electrically connected to the second scan driving circuit SDRV2.

In some embodiments, although not shown, each of auxiliary pixel circuits PCa and intermediate pixel circuits PCt may receive scan signals Sn and light-emitting control signals from the first scan driving circuit SDRV1 and/or the second scan driving circuit SDRV2 through wires extending from scan lines SL and/or light-emitting control lines EL.

The terminal PAD may be arranged at one side of the substrate 100. The terminal PAD is exposed by an insulating layer and is connected to a display circuit board 30. A display driver 31 may be arranged in the display circuit board 30.

The display driver 31 may generate control signals that are transmitted to the first scan driving circuit SDRV1 and the second scan driving circuit SDRV2. The display driver 31 may generate data signals Dm (refer to FIG. 4), and the generated data signals Dm may be transmitted to the main pixel circuits PCm via fan-out wires FW and data lines DL connected to the fan-out wire FW. Although not shown, data signals Dm may be transmitted to the auxiliary pixel circuits PCa via data lines DL or wires extending from data lines DL.

The display driver 31 may supply a driving power voltage ELVDD to the driving voltage supply line 11, and may supply a common power voltage ELVSS to the common voltage supply line 13. The driving power voltage ELVDD is applied to the main pixel circuits PCm via driving voltage lines PL connected to the driving voltage supply line 11. Although not shown, the driving power voltage ELVDD may also be applied to the auxiliary pixel circuits PCa via the driving voltage supply line 11 or wires extending from the driving voltage supply line 11. The common power voltage ELVSS is provided to the common voltage supply line 13 and may be applied to a counter electrode of each of the main light-emitting element LEm, the auxiliary light-emitting element LEa, and the intermediate light-emitting element LEt.

The driving voltage supply line 11 may extend, for example, in an x direction and may be positioned below the main display region MDA. The common voltage supply line 13 has an open loop structure and may partially surround the main display region MDA.

Referring to FIG. 3B, the auxiliary display region ADA is arranged at an inner part of the main display region MDA and may be entirely surrounded by the main display region MDA. An intermediate display region TDA is between the main display region MDA and the auxiliary display region ADA, and the intermediate display region TDA may also be entirely surrounded by the main display region MDA.

Figure 4:
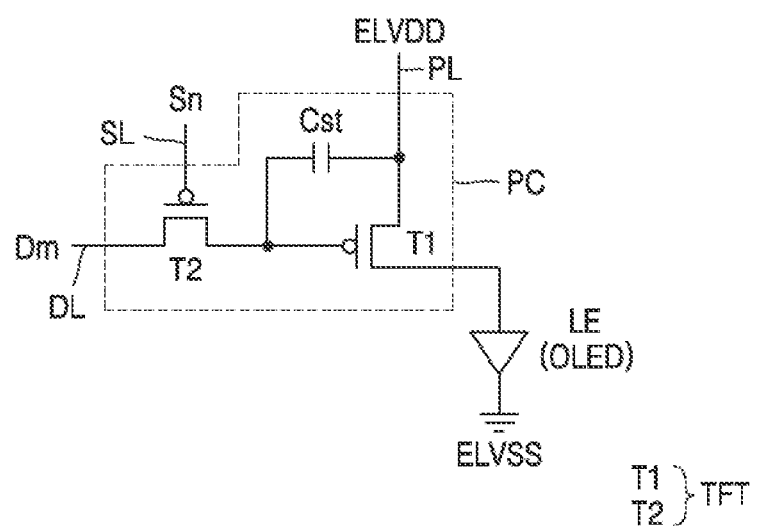
FIG. 4 is an equivalent circuit diagram of a pixel circuit included in a display apparatus according to an embodiment.

FIG. 4 is an equivalent circuit diagram of a pixel circuit included in a display apparatus according to an embodiment.

Referring to FIG. 4, a pixel circuit PC may include thin-film transistors TFT and a storage capacitor Cst, and may be electrically connected to an organic light-emitting diode OLED. In an embodiment, the pixel circuit PC may include a driving thin-film transistor T1, a switching thin-film transistor T2, and a storage capacitor Cst.

The switching thin-film transistor T2 is connected to a scan line SL and a data line DL, and a data signal Dm or a data voltage input from the data line DL may be transmitted to the driving thin-film transistor T1 based on a scan signal Sn or a switching voltage input from the scan line SL. The storage capacitor Cst is connected to the switching thin-film transistor T2 and a driving voltage line PL, and may store a voltage corresponding to a difference between a voltage received from the switching thin-film transistor T2 and a driving power voltage ELVDD supplied to the driving voltage line PL.

The driving thin-film transistor T1 is connected to the driving voltage line PL and the storage capacitor Cst, and may control a driving current flowing from the driving voltage line PL to the organic light-emitting diode OLED in response to a voltage value stored in the storage capacitor Cst. A counter electrode (for example, a cathode) of the organic light-emitting diode OLED may receive a common power voltage ELVSS. The organic light-emitting diode OLED may emit light having a certain luminance according to the driving current.

A case in which the pixel circuit PC includes two thin-film transistors and one storage capacitor has been described, but the disclosure is not limited thereto. For example, the pixel circuit PC may include three or more thin-film transistors and/or two or more storage capacitors. In an embodiment, the pixel circuit PC may include seven thin-film transistors and one storage capacitor. The numbers of thin-film transistors and storage capacitors may be configured according to a design of the pixel circuit PC. However, hereinafter, for convenience of description, a case in which the pixel circuit PC includes two thin-film transistors and one storage capacitor will be described.

A structure of the pixel circuit PC may be applied to a main pixel circuit PCm (see FIG. 3A), an auxiliary pixel circuit PCa (see FIG. 3A), and/or an intermediate pixel circuit PCt (see FIG. 3A).

Figure 5A:
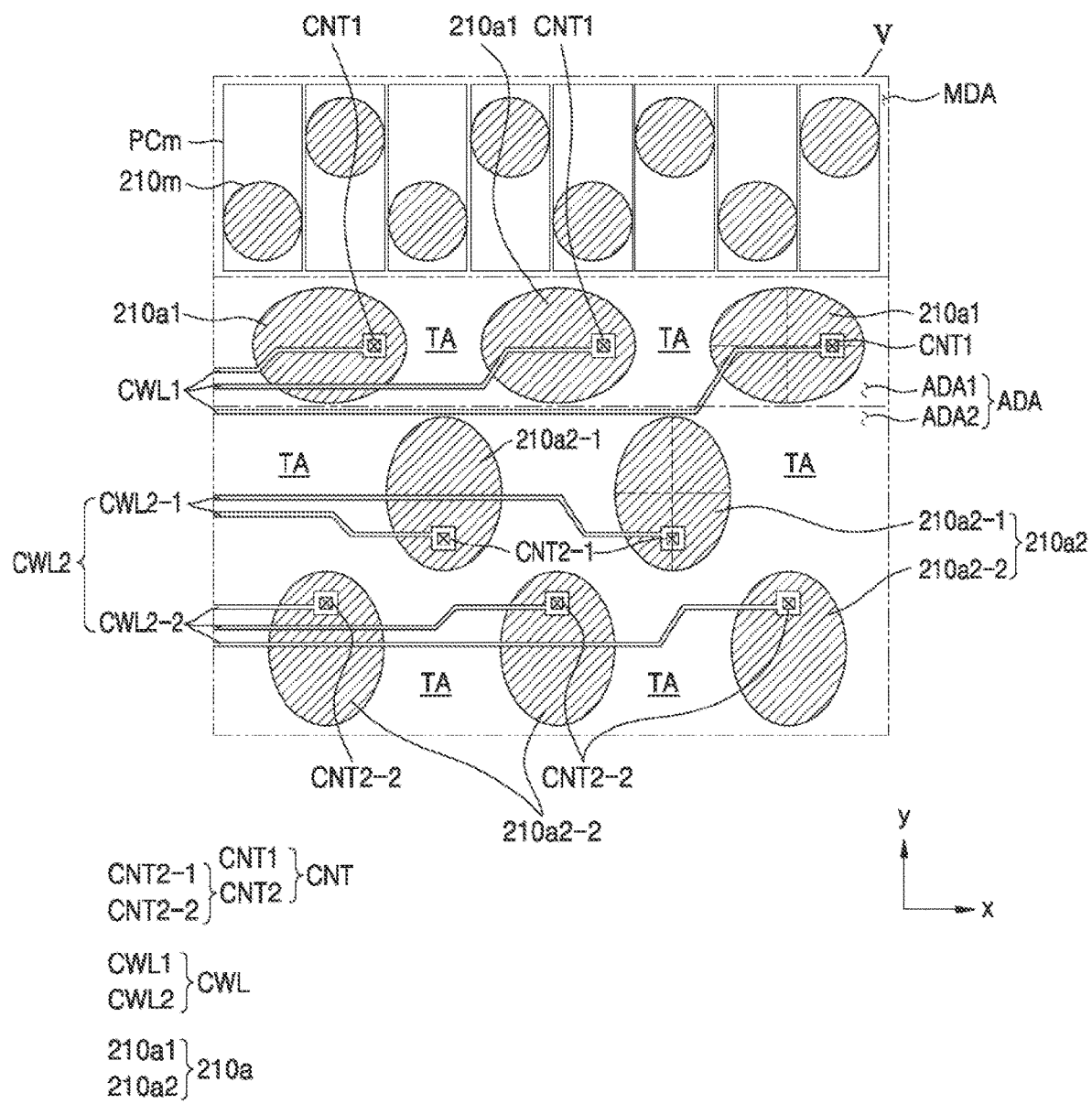
FIG. 5A is a schematic plan view illustrating some components of a display apparatus according to an embodiment.
Figure 5B:
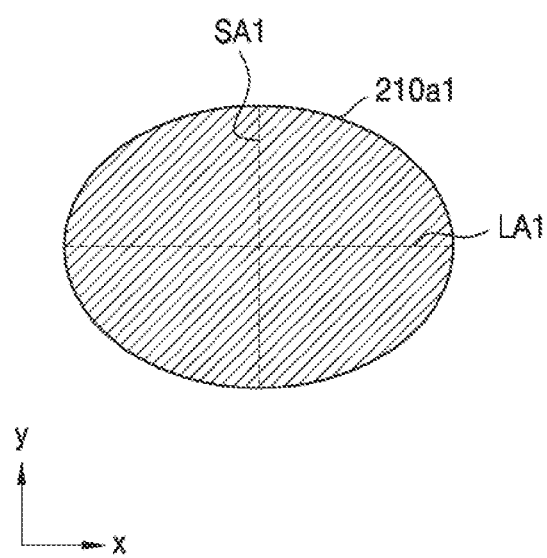
FIG. 5B is a plan view of an auxiliary pixel electrode included in a display apparatus according to an embodiment.
Figure 5C:
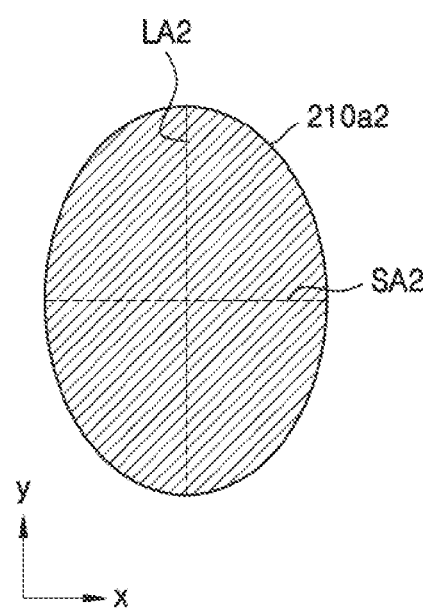
FIG. 5C is a plan view of an auxiliary pixel electrode included in a display apparatus according to an embodiment

FIG. 5A is a schematic plan view of some components of a display apparatus according to an embodiment. FIGS. 5B and 5C are each a plan view of an auxiliary pixel electrode included in a display apparatus according to an embodiment.

FIG. 5A may correspond to a region V of FIG. 3B. FIG. 5A shows main and auxiliary pixel electrodes 210m and 210a, main pixel circuits PCm, and a connection wire CWL arranged in a main display region MDA and an auxiliary display region ADA.

Referring to FIG. 5A, main pixel electrodes 210m and main pixel circuits PCm may be arranged in the main display region MDA. The main pixel circuits PCm may be respectively electrically connected to the main pixel electrodes 210m. Each of the main pixel electrodes 210m may at least partially overlap with a corresponding main pixel circuit PCm in a plan view of the display apparatus 10.

Auxiliary pixel electrodes 210a may be arranged in the auxiliary display region ADA. The auxiliary pixel electrodes 210a may be respectively electrically connected to auxiliary pixel circuits PCa (see FIG. 3B) arranged in an intermediate display region TDA (see FIG. 3B) via the connection wires CWL. A transmission region TA may be between the auxiliary pixel electrodes 210a.

According to an embodiment, the auxiliary display region ADA may include a first region ADA1 adjacent to the main display region MDA in a first direction (for example, −y direction or +y direction) and may include a second region ADA2 spaced apart from the main display region MDA. The first region ADA1 may be positioned between the main display region MDA and the second region ADA2. Here, the expression that two regions are "adjacent in the first direction" may mean that the two regions MDA and ADA1 are arranged in the first direction, and a boundary between the two regions MDA and ADA1 extends in a direction different from (e.g., perpendicular to) the first direction. The first region ADA1 of the auxiliary display region ADA is an outermost region of the auxiliary display region ADA, and may be a region in contact with the main display region MDA. The second region ADA2 of the auxiliary display region ADA may be a region other than the first region ADA1. Although FIG. 5A shows that the first region ADA1 is arranged above the second region ADA2 in a plan view of the display apparatus 10, the first region ADA1 may be arranged below the second region ADA2 in the plan view of the display apparatus 10.

According to an embodiment, the auxiliary pixel electrodes 210a may include first auxiliary pixel electrodes 210a1 arranged in the first region ADA1 of the auxiliary display region ADA and may include second auxiliary pixel electrodes 210a2 arranged in the second region ADA2. The first auxiliary pixel electrodes 210a1 may be arranged in a second direction (for example, −x direction and/or +x direction) different from (e.g., perpendicular to) the first direction (for example, −y direction or +y direction) in the first region ADA1. The first auxiliary pixel electrodes 210a1 may be adjacent to the main display region MDA, that is, the plurality of first auxiliary pixel electrodes 210a1 may be adjacent to the main pixel electrodes 210m. The second auxiliary pixel electrodes 210a2 may be arranged in the first direction (for example, −y direction and/or +y direction) and the second direction (for example, −x direction and/or +x direction) in the second region ADA2. The second auxiliary pixel electrodes 210a2 may be spaced apart from the main pixel electrodes 210m.

According to an embodiment, connection wires CWL may respectively connect the auxiliary pixel circuits PCa (see FIG. 3B) arranged in the intermediate display region TDA (see FIG. 3B) to the corresponding auxiliary pixel electrodes 210a arranged in the auxiliary display region ADA. For example, first connection wires CWL1 may connect the auxiliary pixel circuits PCa to the first auxiliary pixel electrodes 210a1, respectively. The first connection wires CWL1 may be respectively in contact with the first auxiliary pixel electrodes 210a1 via a first contact portion CNT1 arranged on one side of each of the first auxiliary pixel electrodes 210a1. The first connection wires CWL1 may extend from the first region ADA1 of the auxiliary display region ADA to the intermediate display region TDA.

Second connection wires CWL2 may respectively connect the auxiliary pixel circuits PCa to the corresponding second auxiliary pixel electrodes 210a2. The second connection wires CWL2 may be respectively in contact with the second auxiliary pixel electrodes 210a2 via a second contact portion CNT2 arranged on one side of each of the plurality of second auxiliary pixel electrodes 210a2. The second connection wires CWL2 may extend from the second region ADA2 of the auxiliary display region ADA to the intermediate display region TDA.

Referring to FIG. 5A FIG. 5B, and FIG. 5C, in a plan view of the display apparatus 10, each main pixel electrode 210m has a substantially circle shape, whereas each of the auxiliary pixel electrodes 210a may be substantially elliptical shape having a long axis and a short axis.

The long axis may be defined as a straight line connecting a first point of an ellipse to a second point of the ellipse when a distance between the first point and the second point is the longest for the ellipse. The first point and the second point may be two different points arranged at an edge of an auxiliary pixel electrode 210a in a plan view of the display apparatus 10. The short axis may be defined as a straight line connecting a third point to a fourth point of an ellipse when a distance between the third point and the fourth point is the shortest for the ellipse. The third point and the fourth point may be two different points arranged at the edge of the auxiliary pixel electrode 210a in the plan view of the display apparatus 10. The long axis may be longer than the short axis.

For example, as shown in FIG. 5B, a first auxiliary pixel electrode 210a1 may have an oval shape having a long axis LA1 and a short axis SA1. Also, as shown in FIG. 5C, a second auxiliary pixel electrode 210a2 may have an oval shape having a long axis LA2 and a short axis SA2. In an embodiment, the long axis LA1 of the first auxiliary pixel electrode 210a1 and the long axis LA2 of the second auxiliary pixel electrode 210a2 may extend in different directions. For example, the long axis LA1 of the first auxiliary pixel electrode 210a1 may extend in a −x direction and/or a +x direction, and the long axis LA2 of the second auxiliary pixel electrode 210a2 may extend in a −y direction and/or +y direction.

Referring back to FIG. 5A, a long axis of each of the first auxiliary pixel electrodes 210a1 may extend in the second direction, which is different from and/or perpendicular to the first direction. The first direction may be a direction in which the main display region MDA and the first region ADA1 of the auxiliary display region ADA neighbor each other and may be, for example, a −y direction, and the second direction may be a −x direction. That is, the long axis of each of the first auxiliary pixel electrodes 210a1 may extend, for example, in the −x direction. In this case, the long axis of each of the first auxiliary pixel electrodes 210a1 may not extend from the auxiliary display region ADA to the main display region MDA, and may extend parallel to a boundary between the auxiliary display region ADA and the main display region MDA.

If a long axis of the first auxiliary pixel electrode 210a1 extends in the first direction (i.e., the −y direction or +y direction), undesirable interference may occur between the first auxiliary pixel electrode 210a1 and a main pixel electrode 210m. In order to prevent the interference, it may be necessary to increase a distance between the first auxiliary pixel electrode 210a1 and the main pixel electrode 210m. As a result, a boundary between the main display region MDA and the auxiliary display region ADA may be undesirably conspicuous.

According to embodiments, a distance between the main pixel electrodes 210m and the first auxiliary pixel electrodes 210a1 adjacent to each other may be minimized. Advantageously, a boundary between the main display region MDA and the auxiliary display region ADA may be desirably inconspicuous.

In an embodiment, an extension direction of a long axis of each of the second auxiliary pixel electrodes 210a2 may be different from and/or perpendicular to an extension direction of a long axis of each of the first auxiliary pixel electrodes 210a1. That is, a long axis of the first auxiliary pixel electrode 210a1 and a long axis of the second auxiliary pixel electrode 210a2 may extend in different directions. For example, the long axis of each of the second auxiliary pixel electrodes 210a2 may extend in the first direction (i.e., the −y direction or +y direction).

In an embodiment, second contact portions CNT2 respectively provided in second auxiliary pixel electrodes 210a2 arranged in two neighboring rows may be arranged adjacent to each other. The second auxiliary pixel electrodes 210a2 may include a 2-1 auxiliary pixel electrode 210a2-1 arranged in a first row and a 2-2 auxiliary pixel electrode 210a2-2 arranged in a second row adjacent to the first row. The second connection wires CWL2 may include a 2-1 connection wire CWL2-1 electrically connected to the 2-1 auxiliary pixel electrode 210a2-1 via a 2-1 contact portion CNT2-1 and may include a 2-2 connection wire CWL2-2 electrically connected to the 2-2 auxiliary pixel electrode 210a2-2 via a 2-2 contact portion CNT2-2.

In an embodiment, the 2-1 contact portion CNT2-1 may be spaced apart from a short axis of the 2-1 auxiliary pixel electrode 210a2-1 in the first direction (i.e., −y direction or +y direction), and the 2-2 contact portion CNT2-2 may be spaced apart from a short axis of the 2-2 auxiliary pixel electrode 210a2-2 in a direction (i.e., +y direction or −y direction) opposite to the first direction. For example, FIG. 5A shows that the 2-1 contact portion CNT2-1 is spaced apart in the −y direction with respect to the short axis of the 2-1 auxiliary pixel electrode 210a2-1, and the 2-2 contact portion CNT2-2 is spaced apart in the +y direction with respect to the short axis of the 2-2 auxiliary pixel electrode 210a2-2. Accordingly, the 2-1 contact portion CNT2-1 and the 2-2 contact portion CNT2-2 may be adjacent to each other and may be positioned between the corresponding short axes SA2 of the auxiliary pixel electrodes 210a2-1 and 210a2-2. By arranging the second contact portions CNT2 in the two neighboring rows to be adjacent to each other, designing and patterning of the second connection wires CWL2 may be more easily achieved.

In another embodiment, although not shown, in FIG. 5A, the 2-1 contact portion CNT2-1 may be spaced apart in the +y direction with respect to the short axis of the 2-1 auxiliary pixel electrode 210a2-1, and the 2-2 contact portion CNT2-2 may be spaced apart from the short axis of the 2-2 auxiliary pixel electrode 210a2-2 in the −y direction. The corresponding short axes SA2 of the auxiliary pixel electrodes 210a2-1 and 210a2-2 may be positioned between the 2-1 contact portion CNT2-1 and the 2-2 contact portion CNT2-2, which may be spaced apart from each other by a certain distance. By arranging the second contact portions CNT2 in the two neighboring rows to be spaced apart from each other at a regular distance, when the second connection wires CWL2 are designed and patterned, it may be easier to form a large transmission region.

Figure 6:
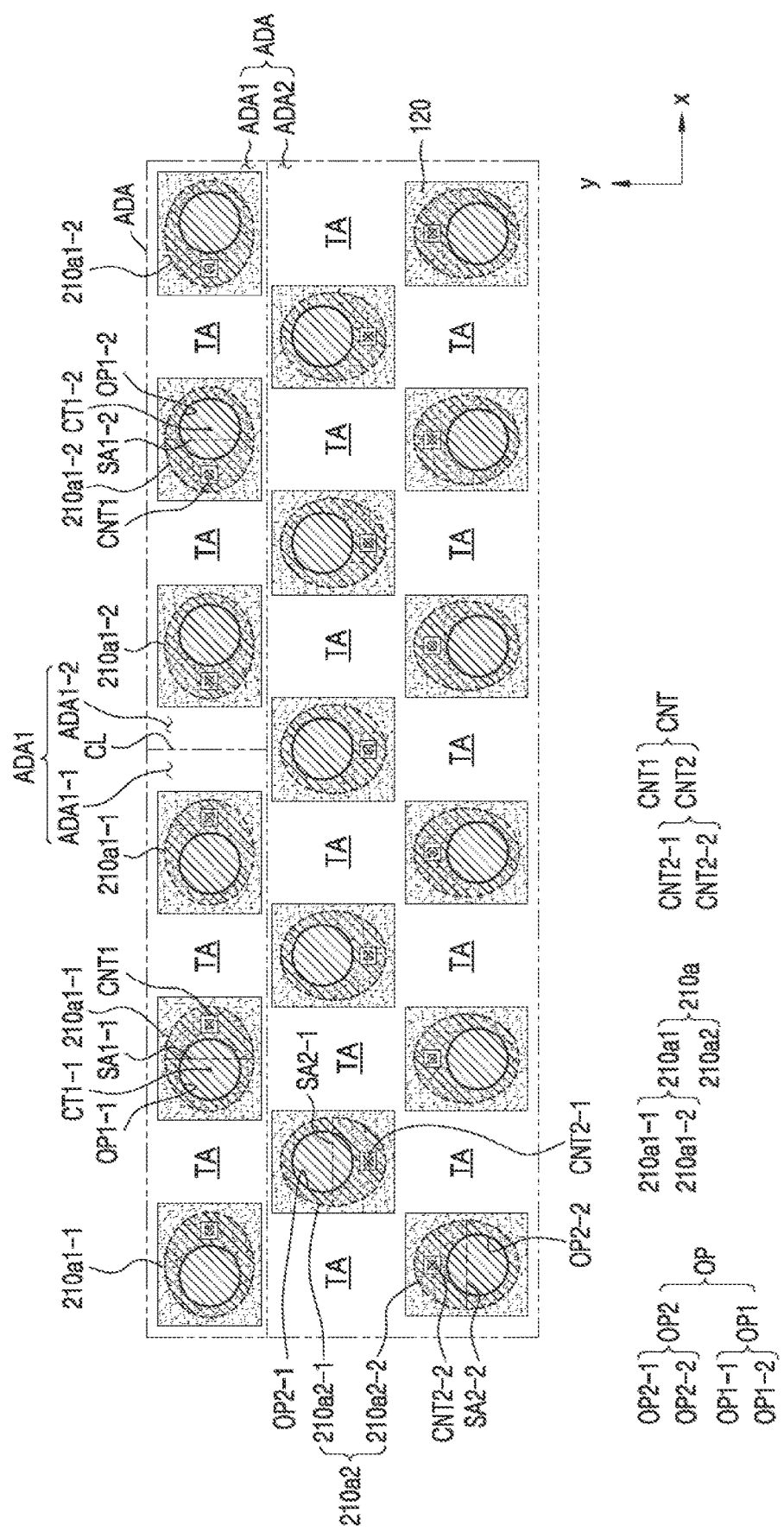
FIG. 6 is a schematic plan view illustrating some components of a display apparatus according to an embodiment.

FIG. 6 is a schematic plan view of some components of a display apparatus according to an embodiment. FIG. 6 shows an auxiliary display region ADA of a display apparatus 10 (see FIGS. 3A and 3B). FIG. 6 shows auxiliary pixel electrodes 210a, contact portions CNT, and a pixel defining layer 120 for convenience of illustration.

Referring to FIG. 6, auxiliary pixel electrodes 210a are spaced apart from each other in a plan view of the display apparatus 10, and a transmission region TA may be between two neighboring auxiliary pixel electrodes 210a. The pixel defining layer 120 may be arranged on the auxiliary pixel electrodes 210a. Because the auxiliary pixel electrodes 210a are arranged under the pixel defining layer 120, an edge of each of the auxiliary pixel electrodes 210a is indicated by a dashed line in FIG. 6. The pixel defining layer 120 may not be arranged in the transmission region TA in order to maximize light transmittance in the auxiliary display region ADA.

In an embodiment, the pixel defining layer 120 may include openings OP each overlapping a portion of each of the auxiliary pixel electrodes 210a. For example, the pixel defining layer 120 may include first openings OP1 each exposing a portion of each of the first auxiliary pixel electrodes 210a1 located in a first region ADA1 of the auxiliary display region ADA. In an embodiment, the first openings OP1 of the pixel defining layer 120 may not overlap with the first contact portions CNT1 in a plan view of the display apparatus 10. Also, the pixel defining layer 120 may include second openings OP2 each exposing a portion of each of the second auxiliary pixel electrodes 210a2 located in a second region ADA2 of the auxiliary display region ADA. In an embodiment, the second openings OP2 of the pixel defining layer 120 may not overlap with the second contact portions CNT2 in a plan view of the display apparatus 10.

According to an embodiment, the first region ADA1 of the auxiliary display region ADA may include a 1-1 region ADA1-1 arranged on one side and a 1-2 region ADA1-2 arranged on the other side with respect to a virtual center line CL extending in the first direction (i.e., −y direction or +y direction). For example, the 1-1 region ADA1-1 may be located on a −x direction side with respect to the virtual center line CL, and the 1-2 region ADA1-2 may be located on a +x direction side with respect to the virtual center line CL. The first auxiliary pixel electrodes 210a1 may include a 1-1 auxiliary pixel electrode 210a1-1 arranged in the 1-1 region ADA1-1 and may include a 1-2 auxiliary pixel electrode 210a1-2 arranged in the 1-2 region ADA1-2.

According to an embodiment, the first openings OP1 of the pixel defining layer 120 may be respectively arranged on one side of corresponding first auxiliary pixel electrodes 210a1. For example, the first openings OP1 of the pixel defining layer 120 may include a 1-1 opening OP1-1 exposing the 1-1 auxiliary pixel electrode 210a1-1 and may include a 1-2 opening OP1-2 exposing the 1-2 auxiliary pixel electrode 210a1-2. A center CT1-1 of the 1-1 opening OP1-1 may be spaced apart from a short axis SA1-1 of the 1-1 auxiliary pixel electrode 210a1-1 in the second direction (i.e., −x direction or +x direction). A center CT1-2 of the 1-2 opening OP1-2 may be spaced apart from a short axis SA1-2 of the 1-2 auxiliary pixel electrode 210a1-2 in a direction (i.e., +x direction or −x direction) opposite to the second direction. FIG. 6 shows that the center CT1-1 of the 1-1 opening OP1-1 is spaced apart from the short axis SA1-1 of the 1-1 auxiliary pixel electrode 210a1-1 in the −x direction, and the center CT1-2 of the 1-2 opening OP1-2 is spaced apart from the short axis SA1-2 of the 1-2 auxiliary pixel electrode 210a1-2 in the +x direction. The short axes SA1-1 and SA1-2 may be positioned between the centers CT1-1 and CT1-2.

Similarly, the second openings OP2 of the pixel defining layer 120 may be respectively arranged on one side of corresponding second auxiliary pixel electrodes 210a2. For example, as shown in FIG. 6, the second openings OP2 of the pixel defining layer 120 may include a 2-1 opening OP2-1 exposing a 2-1 auxiliary pixel electrode 210a2-1 and may include a 2-2 opening OP2-2 exposing a 2-2 auxiliary pixel electrode 210a2-2. A center of the 2-1 opening OP2-1 may be spaced apart from a short axis SA2-1 of the 2-1 auxiliary pixel electrode 210a2-1 in, for example, the +y direction, and a center of the 2-2 opening OP2-2 may be spaced apart from a short axis SA2-2 of the 2-2 auxiliary pixel electrode 210a2-2 in the −y direction. The two short axes SA2-1 and SA2-2 may be positioned between the two centers.

Although not shown in FIG. 6, a shape of the pixel defining layer 120 in the first region ADA1 may be similar to a shape of a first auxiliary pixel electrode 210a1. For example, the pixel defining layer 120 may have an oval shape, a circle shape, or a distorted circle shape. An edge portion of the pixel defining layer 120 may be identical to or greater than an edge of the first auxiliary pixel electrode 210a1 in the plan view of the display apparatus 10.

Similarly, a shape of the pixel defining layer 120 in the second region ADA2 may be similar to a shape of a second auxiliary pixel electrode 210a2. For example, the pixel defining layer 120 may have an oval shape, a circle shape, or a distorted circle shape. An edge portion of the pixel defining layer 120 may be identical to or greater than an edge of the second auxiliary pixel electrode 210a2 in the plan view of the display apparatus 10.

Although not shown in FIG. 6, an intermediate layer (not shown) including an emission layer emitting light of a certain color is arranged on the auxiliary pixel electrodes 210a, and may be located in an opening OP of the pixel defining layer 120. For example, the emission layer may be a red emission layer, a green emission layer, or a blue emission layer. A counter electrode (not shown) may be arranged on the pixel defining layer 120 and the intermediate layer, and may be formed into a single body over multiple auxiliary pixel electrodes 210a. A stacked structure of an auxiliary pixel electrode 210a, the intermediate layer, and the counter electrode is one auxiliary light-emitting element LEa (see FIG. 2), and may form an organic light-emitting diode OLED.

Figure 7:
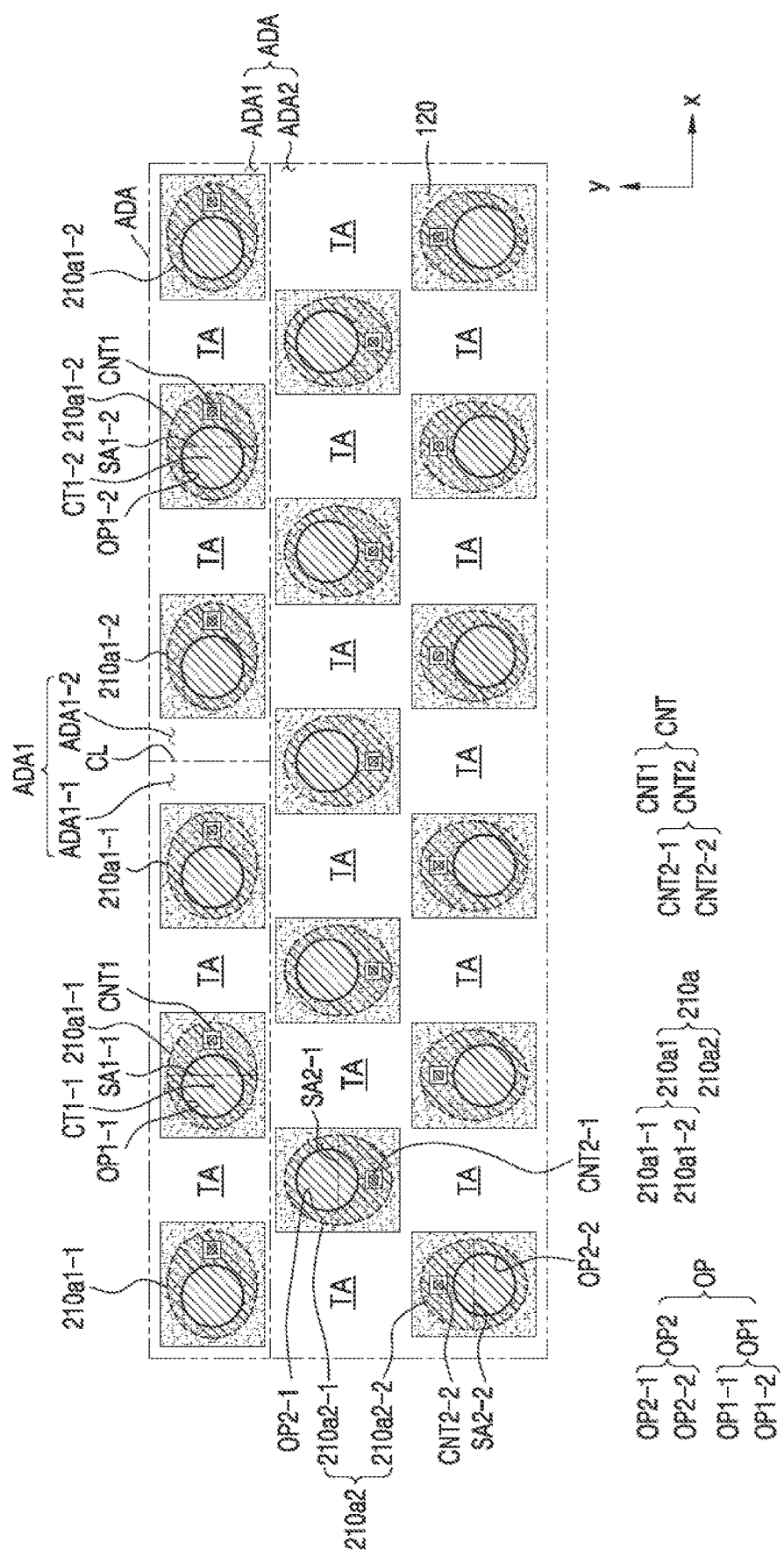
FIG. 7 is a schematic plan view illustrating some components of a display apparatus according to another embodiment.

FIG. 7 is a schematic plan view of some components of a display apparatus according to an embodiment. FIG. 7 may be a modified example of the display apparatus of FIG. 6. Descriptions of the same components as components described above with reference to FIG. 6 are omitted, and differences are mainly described below.

Referring to FIG. 7, center points CT1 of first openings OP1 of a pixel defining layer 120 may be respectively arranged on one side of corresponding first auxiliary pixel electrodes 210a1, and may be arranged on the same side with respect to the short axes of the corresponding first auxiliary pixel electrodes 210a1. For example, a center CT1-1 of a 1-1 opening OP1-1 of the pixel defining layer 120 may be spaced apart from a short axis SA1-1 of a 1-1 auxiliary pixel electrode 210a1-1 in a second direction (i.e., −x direction or +x direction), and a center CT1-2 of a 1-2 opening OP1-2 may also be spaced apart from a short axis SA1-2 of a 1-2 auxiliary pixel electrode 210a1-2 in the second direction. For example, FIG. 6 shows that the center CT1-1 of the 1-1 opening OP1-1 is spaced apart from the short axis SA1-1 of the 1-1 auxiliary pixel electrode 210a1-1 in the −x direction, and the center CT1-2 of the 1-2 opening OP1-2 is spaced apart from the short axis SA1-2 of the 1-2 auxiliary pixel electrode 210a1-2 in the −x direction.

Figure 8:
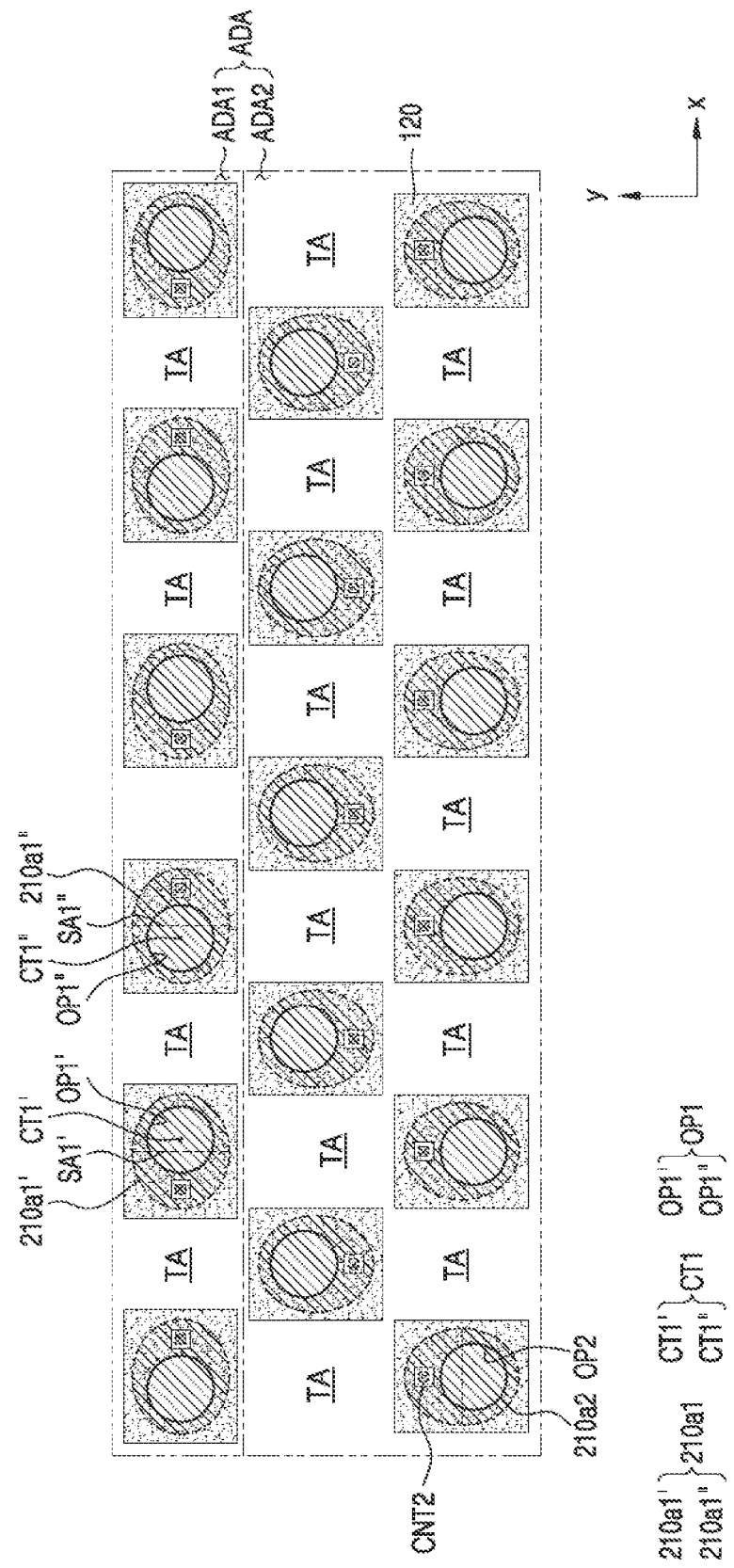
FIG. 8 is a schematic plan view illustrating some components of a display apparatus according to another embodiment.

FIG. 8 is a schematic plan view of some components of a display apparatus according to an embodiment. FIG. 8 may be a modified example of the display apparatus of FIG. 6. Descriptions of the same components as components described above with reference to FIG. 6 are omitted, and differences are mainly described below.

Referring to FIG. 8, center points CT1 of first openings OP1 of a pixel defining layer 120 may be respectively arranged on one side of corresponding first auxiliary pixel electrodes 210a1, and may be alternately spaced apart from the short axes of the corresponding first auxiliary pixel electrodes 210a1 in one direction or the opposite direction. When a center point CT1' of a first opening OP1' is spaced apart from a short axis SA1' of a corresponding first auxiliary pixel electrode 210a1' in a second direction (i.e., −x direction or +x direction), a center point CT1" of a first opening OP1" immediately adjacent to the first opening OP1' may be spaced apart from a short axis SA1" of a corresponding first auxiliary pixel electrode 210a1" in a direction (i.e., +x direction or −x direction) opposite to the second direction. Positions of the first openings OP1 may be configured according to embodiments. By arranging the first openings OP1, designing and patterning of the first connection wires CWL1 may be more easily achieved. When the first connection wires CWL1 are designed and patterned, it may be easier to form a large transmission region TA.

Figure 9:
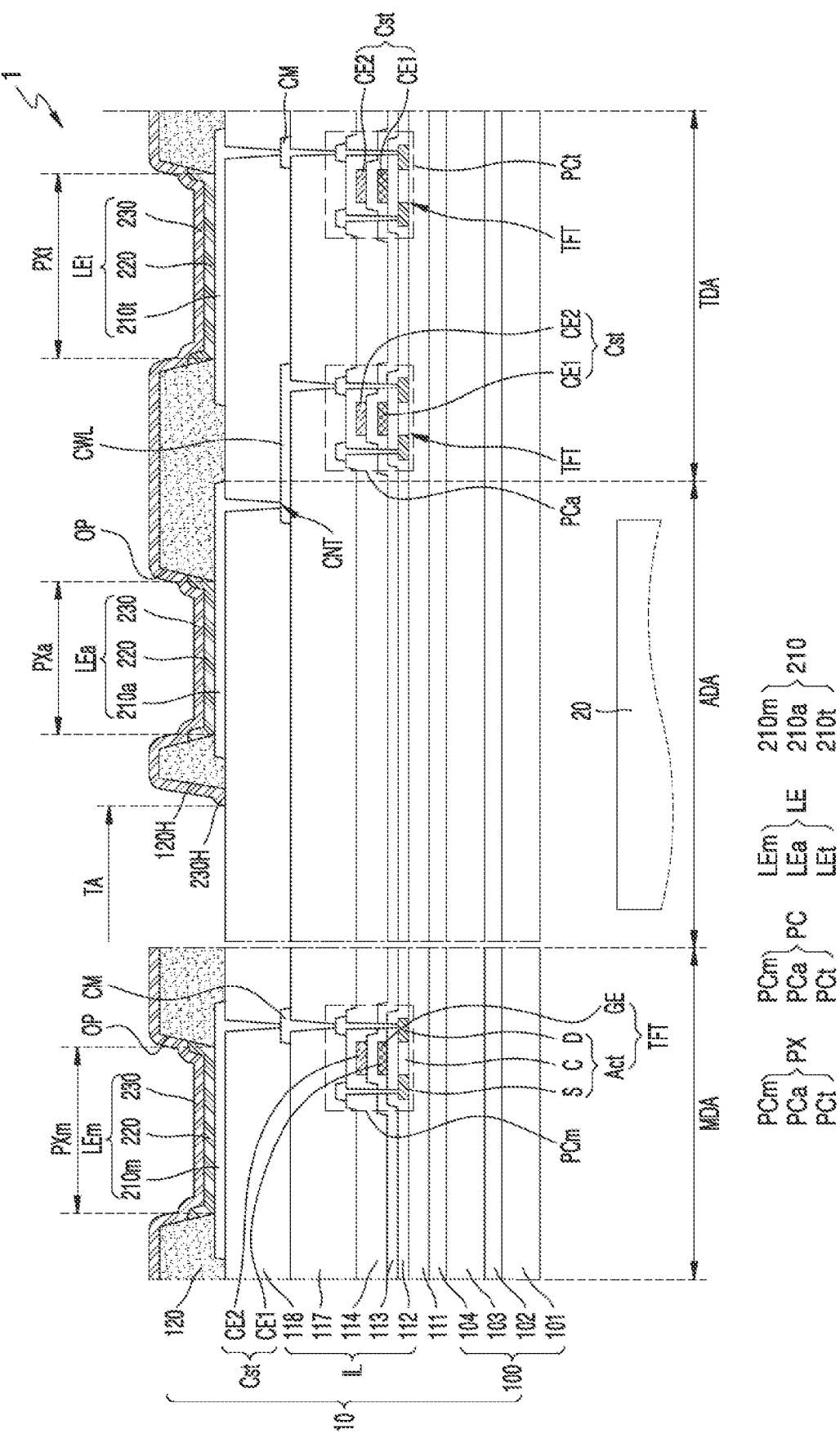
FIG. 9 is a schematic cross-sectional view of a display apparatus included in an electronic device according to an embodiment.

FIG. 9 is a schematic cross-sectional view of a display apparatus included in an electronic device according to an embodiment. A stacked structure of a display apparatus 10 will be described with reference to FIG. 6.

Referring to FIG. 9, the display apparatus 10 includes a substrate 100, which may include glass or a polymer resin. For example, the substrate 100 may include a polymer resin, such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). When the substrate 100 includes a polymer resin, the substrate 100 may be flexible and/or bendable.

The substrate 100 may have a single-layer or multi-layer structure. The multi-layer structure may include an inorganic layer. For example, the substrate 100 may include a first base layer 101, a first barrier layer 102, a second base layer 103, and a second barrier layer 104, which are sequentially stacked. The first base layer 101 and the second base layer 103 may each include a polymer resin. The first barrier layer 102 and the second barrier layer 104 are barrier layers that prevent penetration of foreign materials, and may be a single layer or multiple layers including an inorganic material such as silicon nitride ($SiN_x$) or silicon oxide ($SiO_x$).

A buffer layer 111 may be arranged on the substrate 100. The buffer layer 111 may increase smoothness of an upper surface of the substrate 100. The buffer layer 111 may include an oxide film such as a silicon oxide ($SiO_x$) film, a nitride film such as silicon nitride ($SiN_x$) film, and/or a silicon oxynitride ($SiO_xN_y$) film.

A main pixel circuit PCm, an auxiliary pixel circuit PCa, and an intermediate pixel circuit PCt may be arranged on the buffer layer 111. The main pixel circuit PCm may be electrically connected to a main light-emitting element LEm located in a main display region MDA. The auxiliary pixel circuit PCa may be electrically connected to an auxiliary light-emitting element LEa located in an auxiliary display region ADA. The intermediate pixel circuit PCt may be electrically connected to an intermediate light-emitting element LEt located in an intermediate display region TDA.

In an embodiment, the main pixel circuit PCm, the auxiliary pixel circuit PCa, and the intermediate pixel circuit PCt may each include first and second thin-film transistors T1 and T2 described above with reference to FIG. 4, though only one thin-film transistor TFT is illustrated in FIG. 9. In an embodiment, the main pixel circuit PCm, the auxiliary pixel circuit PCa, and the intermediate pixel circuit PCt may have the similar configuration; thus, a stacked structure of the main pixel circuit PCm will be mainly described as an example.

A semiconductor layer Act may be arranged on the buffer layer 111. The semiconductor layer Act may include polysilicon. In another embodiment, the semiconductor layer Act may include amorphous silicon. In another embodiment, the semiconductor layer Act may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn).

The semiconductor layer Act may include a channel region C, and may include a source region S and a drain region D on opposite sides of the channel region C. For example, the source region S and the drain region D may be doped with an impurity, which may include an N-type impurity or a P-type impurity. The channel region C may overlap a gate electrode GE, and may not be doped with an impurity or may include an extremely small amount of impurities. The source region S and the drain region D may respectively correspond to a source electrode and a drain electrode of a thin-film transistor TFT. The source region S and the drain region D may be interchanged according to properties of the thin-film transistor TFT. Hereinafter, for convenience of description, the terms, that is, the source region S and the drain region D, are used instead of the source electrode or the drain electrode.

A gate insulating layer 112 may be located on the semiconductor layer Act. The gate insulating layer 112 may include an inorganic material including an oxide or a nitride. For example, the gate insulating layer 112 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

The gate electrode GE may be arranged on the gate insulating layer 112. The gate electrode GE may include at least a portion overlapping the semiconductor layer Act. For example, the gate electrode GE may overlap the channel region C of the semiconductor layer Act. The gate electrode GE of the thin-film transistor TFT may include, for example, a low-resistance conductive material such as molybdenum (Mo), aluminum (Al), copper (Cu), and/or titanium (Ti), and may have a single-layer or multi-layer structure.

A first capacitor Cst may include a first electrode CE1 and a second electrode CE2. In an embodiment, the first capacitor Cst may overlap the thin-film transistor TFT. In this case, the gate electrode GE may function not only as a gate electrode of the thin-film transistor TFT but also as the first electrode CE1. That is, the gate electrode GE and the first electrode CE1 may be a single body. The first electrode CE1 may be an island-shaped electrode. In another embodiment, the first capacitor Cst may not overlap the thin-film transistor TFT and may exist at a separate position.

A first insulating interlayer 113 may be arranged on the gate electrode GE. The first insulating interlayer 113 may include an inorganic material including an oxide or a nitride. For example, the first insulating interlayer 113 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

The second electrode CE2 of the first capacitor Cst may overlap the first electrode CE1. In this case, the first insulating interlayer 113 may be interposed between the first electrode CE1 and the second electrode CE2, and the first insulating interlayer 113 may serve as a dielectric layer of the first capacitor Cst. A storage capacitance may be determined by an electric charge stored in the first capacitor Cst and a voltage between the electrodes CE1 and CE2.

The second electrode CE2 of the first capacitor Cst may include a metal, an alloy, a conductive metal oxide, and/or a transparent conductive material. The second electrode CE2 may include, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may include a single layer or multiple layers.

A second insulating interlayer 114 may be arranged on the second electrode CE2 of the first capacitor Cst. The second insulating interlayer 114 may include an inorganic material including an oxide or a nitride. For example, the second insulating interlayer 114 may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$).

A first planarization layer 117 may be arranged on the second insulating interlayer 114, and a second planarization layer 118 may be arranged on the first planarization layer 117. A contact metal CM and a connection wire CWL may be arranged between the first planarization layer 117 and the second planarization layer 118. The first planarization layer 117 and the second planarization layer 118 may include an organic material such as acrylic, benzocyclobutene (BCB), polyimide, or hexamethyldisiloxane (HMDSO).

A contact metal CM may electrically connect the main pixel circuit PCm and the main light-emitting element LEm to each other, or may electrically connect the intermediate pixel circuit PCt and the intermediate light-emitting element LEt to each other. The contact metal CM may include, for example, a low-resistance conductive material such as molybdenum (Mo), aluminum (Al), copper (Cu), and/or titanium (Ti).

The connection wire CWL may electrically connect the auxiliary pixel circuit PCa and the auxiliary light-emitting element LEa to each other. For example, an end of the connection wire CWL may be connected to an auxiliary pixel electrode 210a of the auxiliary light-emitting element LEa; the other end of the connection wire CWL may be connected to the auxiliary pixel circuit PCa. A portion where the connection wire CWL and the auxiliary pixel electrode 210a are connected to each other may be a contact portion CNT described above.

In an embodiment, the connection wire CWL may include a transparent conductive material. The connection wire CWL may include, for example, a transparent conducting oxide (TCO). The connection wire CWL may include, for example, a conductive oxide such as indium tin oxide (ITO), indium zinc oxide (IZO), zinc oxide (ZnO), indium oxide ($In_2O_3$), indium gallium oxide (IGO), indium zinc gallium oxide (IZGO), and/or aluminum zinc oxide (AZO).

Pixel electrodes 210 may be arranged above the second planarization layer 118. The pixel electrodes 210 may include main pixel electrodes 210m arranged in the main display region MDA, auxiliary pixel electrodes 210a arranged in the auxiliary display region ADA, and intermediate pixel electrodes 210t arranged in the intermediate display region TDA. Each of the pixel electrodes 210 may include a light-transmitting conductive layer formed of a light-transmitting conductive oxide such as ITO, $In_2O_3$, or IZO and may include a reflective layer formed of a metal such as Al or Ag. For example, a pixel electrode 210 may have a three-layer structure of ITO/Ag/ITO.

A pixel defining layer 120 is arranged on the pixel electrode 210. The pixel defining layer 120 may define a pixel PX by having an opening corresponding to each pixel PX, that is, an opening OP through which at least a central portion of the pixel electrode 210 is exposed. For example, the pixel defining layer 120 may define a main pixel PXm, an auxiliary pixel PXa, and an intermediate pixel PXt by having openings OP respectively exposing a portion of the main pixel electrode 210m, a portion of the auxiliary pixel electrode 210a, and a portion of an intermediate pixel electrode 210t. The pixel defining layer 120 may increase a distance between an edge of the pixel electrode 210 and a counter electrode 230, for preventing an undesirable arc between the electrodes.

The pixel defining layer 120 may include an organic insulation material. Alternatively, the pixel defining layer 120 may include an inorganic insulation material, such as silicon nitride, silicon oxynitride, and/or silicon oxide. Alternatively, the pixel defining layer 120 may include an organic insulation material and an inorganic insulation material.

In some embodiments, the pixel defining layer 120 includes a light blocking material, and may be black. The light blocking material may include carbon black, carbon nanotubes, a resin or paste including black dye, metal particles such as nickel, aluminum, molybdenum and alloys thereof, metal oxide particles (for example, chromium oxide), and/or metal nitride particles (for example, chromium nitride). When the pixel defining layer 120 includes a light blocking material, reflection of external light by a metal structure arranged under the pixel defining layer 120 may be reduced.

An intermediate layer 220 may be arranged on the pixel defining layer 120. The intermediate layer 220 may be arranged between the pixel electrode 210 and the counter electrode 230. The intermediate layer 220 may include an emission layer that overlaps the pixel electrode 210. The emission layer may include an organic light-emitting material, such as a polymer or low-molecular weight organic material, and may emit light of a certain color. Alternatively, the emission layer may include an inorganic light-emitting material or may include a quantum dot.

As an optional embodiment, functional layers such as a hole transport layer (HTL), a hole injection layer (HIL), an electron transport layer (ETL), and an electron injection layer (EIL) may be further arranged below and above the emission layer. For example, a first functional layer among the functional layers may be a HTL having a single-layer structure, and may be formed of poly-(3,4)-ethylene-dihydroxythiophene (PEDOT) or polyaniline (PANI). Alternatively, the first functional layer may include a HIL and a HTL. A second functional layer among the functional layers may include an ETL and/or an EIL.

The counter electrode 230 is arranged on the intermediate layer 220, and may cover the main display region MDA, a partial region of the auxiliary display region ADA, and the intermediate display region TDA. The counter electrode 230 may be a single body that covers some or all of the pixel electrodes 210. The counter electrode 230 may extend from the main display region MDA to a peripheral region PA. The counter electrode 230 may include a conductive material with a low work function. For example, the counter electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may include an oxide layer, formed of ITO, IZO, ZnO, and/or $In_2O_3$, on the (semi)transparent layer.

A stacked structure of the pixel electrode 210, the intermediate layer 220, and the counter electrode 230 is a light-emitting element LE and may form an organic light-emitting diode OLED. For example, a stacked structure of the main pixel electrode 210m, the intermediate layer 220, and the counter electrode 230 may form the main light-emitting element LEm, a stacked structure of the auxiliary pixel electrode 210a, the intermediate layer 220, and the counter electrode 230 may form the auxiliary light-emitting element LEa, and a stacked structure of the intermediate pixel electrode 210t, the intermediate layer 220, and the counter electrode 230 may form the intermediate light-emitting element LEt.

An electronic component 20 may overlap the auxiliary display region ADA. A transmission region TA in the auxiliary display region ADA may transmit light emitted from the electronic component 20 or directed toward the electronic component 20. In some embodiments, the pixel defining layer 120 and the counter electrode 230 may respectively include holes 120H and 230H, which are located in the transmission region TA and overlap with each other. In another embodiment, the gate insulating layer 112, the first insulating interlayer 113, the second insulating interlayer 114, the first planarization layer 117, and the second planarization layer 118 on the substrate 100 may each include holes located in the transmission region TA and overlapping with each other. Accordingly, light transmittance in the transmission region TA may be maximized.

In an embodiment, a bottom metal layer BML may be located under a pixel circuit PC. The bottom metal layer BML may be interposed between the substrate 100 and the buffer layer 111. The bottom metal layer BML may overlap a thin-film transistor TFT of each of the main pixel circuit PCm and the auxiliary pixel circuit PCa. The bottom metal layer BML may not overlap the transmission region TA of the auxiliary display region ADA so as not to cause a decrease in the light transmittance in the transmission region TA. Although not shown, the bottom metal layer BML may be electrically connected to the pixel circuit PC to receive a constant voltage. Accordingly, the thin-film transistor TFT of the pixel circuit PC may be of help to have stable electrical characteristics.

Embodiments may be related to methods for manufacturing the display apparatus and/or the electronic device.

According to embodiments, an image may be advantageously displayed in an auxiliary display region in which an electronic component is arranged, and a boundary between a main display region and the auxiliary display region may be desirably inconspicuous.

The described embodiments are illustrative and not for purposes of limitation. Description of features or aspects within each embodiment should typically be considered as available for other similar features or aspects in other embodiments. Various changes may be made in the described embodiments without departing from the scope defined by the following claims.

What is claimed is:

1. A display apparatus comprising:
a substrate having a main display region, a first auxiliary display region adjacent to the main display region in a first direction, a second auxiliary display region spaced apart from the main display region having the first auxiliary display region therebetween, and an intermediate display region adjacent to the first auxiliary display region and the second auxiliary display region;
a first auxiliary pixel electrode arranged in the first auxiliary display region and having an elliptical shape having a long axis and a short axis;
a second auxiliary pixel electrode arranged in the second auxiliary display region and having an elliptical shape having a long axis and a short axis; and
a first auxiliary pixel circuit and a second auxiliary pixel circuit arranged in the intermediate display region and respectively electrically connected to the first auxiliary pixel electrode and the second auxiliary pixel electrode,
wherein a long axis of the first auxiliary pixel electrode extends in a second direction intersecting with the first direction.

2. The display apparatus of claim 1, wherein an extension direction of a long axis of the second auxiliary pixel electrode intersects with an extension direction of the long axis of the first auxiliary pixel electrode.

3. The display apparatus of claim 2, wherein the long axis of the second auxiliary pixel electrode extends in the first direction.

4. The display apparatus of claim 1, further comprising a first connection wire electrically connecting the first auxiliary pixel circuit and the first auxiliary pixel electrode to each other,
wherein the first connection wire is connected to the first auxiliary pixel electrode via a first contact portion arranged on one side of the first auxiliary pixel electrode.

5. The display apparatus of claim 4, further comprising a pixel defining layer including a first opening exposing a portion of the first auxiliary pixel electrode,
wherein the first opening of the pixel defining layer does not overlap the first contact portion in a plan view.

6. The display apparatus of claim 5, wherein the first auxiliary display region comprises a 1-1 region arranged on one side and a 1-2 region arranged on the other side with respect to a virtual center line extending in the first direction,
the first auxiliary pixel electrode is provided as a plurality of first auxiliary pixel electrodes, and the plurality of first auxiliary pixel electrodes comprises a 1-1 auxiliary pixel electrode arranged in the 1-1 region and a 1-2 auxiliary pixel electrode arranged in the 1-2 region, and
the first opening is provided as a plurality of first openings of the pixel defining layer, and the plurality of first openings comprises a 1-1 opening overlapping the 1-1 auxiliary pixel electrode and a 1-2 opening overlapping the 1-2 auxiliary pixel electrode, wherein a center of the 1-1 opening is spaced apart from a short axis of the 1-1 auxiliary pixel electrode in the second direction, and a center of the 1-2 opening is spaced apart from a short axis of the 1-2 auxiliary pixel electrode in a direction opposite to the second direction.

7. The display apparatus of claim 2, further comprising a second connection wire electrically connecting the second auxiliary pixel circuit and the second auxiliary pixel electrode to each other,
wherein the second connection wire is connected to the second auxiliary pixel electrodes via a second contact portion arranged on one side of the second auxiliary pixel electrode.

8. The display apparatus of claim 7, further comprising a pixel defining layer including a second opening exposing a portion of the second auxiliary pixel electrode,
wherein the second opening of the pixel defining layer does not overlap the second contact portion in a plan view.

9. The display apparatus of claim 8, wherein the second auxiliary pixel electrode is provided as a plurality of second auxiliary pixel electrodes, the plurality of second auxiliary pixel electrodes comprises a 2-1 auxiliary pixel electrode arranged in a first row and a 2-2 auxiliary pixel electrode arranged in a second row adjacent to the first row,
the second connection wire is provided as a plurality of second connection wires, the plurality of second connection wires comprises a 2-1 connection wire electrically connected to the 2-1 auxiliary pixel electrode via a 2-1 contact portion and a 2-2 connection wire electrically connected to the 2-2 auxiliary pixel electrode via a 2-2 contact portion, and
the 2-1 contact portion is spaced apart from a short axis of the 2-1 auxiliary pixel electrode in the first direction, and the 2-2 contact portion is spaced apart from a short axis of the 2-2 auxiliary pixel electrode in a direction opposite to the first direction.

10. The display apparatus of claim 1, further comprising a main pixel electrode arranged in the main display region,
a main pixel circuit arranged in the main display region and electrically connected to the main pixel electrode,
an intermediate pixel electrode arranged in the intermediate display region, and
an intermediate pixel circuit arranged in the intermediate display region and electrically connected to the intermediate pixel electrode.

11. The display apparatus of claim 1, further comprising an intermediate layer on the first auxiliary pixel electrode and the second auxiliary pixel electrode, and
a counter electrode arranged on the intermediate layer and covering the first auxiliary pixel electrode and the second auxiliary pixel electrode.

12. An electronic device comprising:
a display apparatus comprising a main display region, a first auxiliary display region adjacent to the main display region in a first direction, a second auxiliary display region spaced apart from the main display region having the first auxiliary display region therebetween, and an intermediate display region arranged adjacent to the first auxiliary display region and the second auxiliary display region; and
an electronic component arranged to overlap a transmissive region provided in the first auxiliary display region and the second auxiliary display region,
wherein the display apparatus comprises:
a first auxiliary pixel electrode arranged in the first auxiliary display region and having an elliptical shape having a long axis and a short axis;
a second auxiliary pixel electrode arranged in the second auxiliary display region and having an elliptical shape having a long axis and a short axis; and
a first auxiliary pixel circuit and a second auxiliary pixel circuit arranged in the intermediate display region and respectively electrically connected to the first auxiliary pixel electrode and the second auxiliary pixel electrode;
wherein a long axis of the first auxiliary pixel electrode extends in a second direction intersecting with the first direction.

13. The electronic device of claim 12, wherein an extension direction of a long axis of the second auxiliary pixel electrode intersects with an extension direction of the long axis of the first auxiliary pixel electrode.

14. The electronic device of claim 13, wherein the long axis of the second auxiliary pixel electrode extends in the first direction.

15. The electronic device of claim 12, further comprising a first connection wire electrically connecting the first auxiliary pixel circuit and the first auxiliary pixel electrode to each other,
wherein the first connection wire is connected to the first auxiliary pixel electrode via a first contact portion arranged on one side of the first auxiliary pixel electrode.

16. The electronic device of claim 15, further comprising a pixel defining layer including a first opening exposing a portion of the first auxiliary pixel electrode,
wherein the first opening of the pixel defining layer does not overlap the first contact portion in a plan view.

17. The electronic device of claim 16, wherein the first auxiliary display region comprises a 1-1 region arranged on one side and a 1-2 region arranged on other side with respect to a virtual center line extending in the first direction,
the first auxiliary pixel electrode is provided as a plurality of first auxiliary pixel electrodes, and the plurality of first auxiliary pixel electrodes comprises a 1-1 auxiliary pixel electrode arranged in the 1-1 region and a 1-2 auxiliary pixel electrode arranged in the 1-2 region, and
the first opening is provided as a plurality of first openings of the pixel defining layer, and the plurality of first openings comprises a 1-1 opening overlapping the 1-1 auxiliary pixel electrode and a 1-2 opening overlapping the 1-2 auxiliary pixel electrode, wherein a center of the 1-1 opening is spaced apart from a short axis of the 1-1 auxiliary pixel electrode in the second direction, and a center of the 1-2 opening is spaced apart from a short axis of the 1-2 auxiliary pixel electrode in a direction opposite to the second direction.

18. The electronic device of claim 13, further comprising a second connection wire electrically connecting the second auxiliary pixel circuit and the second auxiliary pixel electrode to each other,
wherein the second connection wire is connected to the second auxiliary pixel electrode via a second contact portion arranged on one side of the second auxiliary pixel electrode.

19. The electronic device of claim 18, further comprising a pixel defining layer including a second opening exposing a portion of the second auxiliary pixel electrode,
wherein the second opening does not overlap the second contact portion in a plan view.

20. The electronic device of claim 19, wherein the second auxiliary pixel electrode is provided as a plurality of second auxiliary pixel electrodes and the plurality of second auxiliary pixel electrodes comprises a 2-1 auxiliary pixel electrode arranged in a first row and a 2-2 auxiliary pixel electrode arranged in a second row adjacent to the first row, the second connection wire is provided as a plurality of second connection wires and the plurality of second connection wires comprise a 2-1 connection wire electrically connected to the 2-1 auxiliary pixel electrode via a 2-1 contact portion and a 2-2 connection wire electrically connected to the 2-2 auxiliary pixel electrode via a 2-2 contact portion, the 2-1 contact portion is spaced apart from a short axis of the 2-1 auxiliary pixel electrode in the first direction, and the 2-2 contact portion is spaced apart from a short axis of the 2-2 auxiliary pixel electrode in a direction opposite to the first direction.

* * * * *